(12) United States Patent
Wang et al.

(10) Patent No.: US 11,454,491 B2
(45) Date of Patent: *Sep. 27, 2022

(54) SYSTEMS HAVING LIGHT SOURCE WITH EXTENDED SPECTRUM FOR SEMICONDUCTOR CHIP SURFACE TOPOGRAPHY METROLOGY

(71) Applicant: YANGTZE MEMORY TECHNOLOGIES CO., LTD., Wuhan (CN)

(72) Inventors: Sicong Wang, Wuhan (CN); Xiaoye Ding, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/910,676

(22) Filed: Jun. 24, 2020

(65) Prior Publication Data

US 2021/0262778 A1 Aug. 26, 2021

Related U.S. Application Data

(63) Continuation of application No. PCT/CN2020/076430, filed on Feb. 24, 2020.

(51) Int. Cl.
*G01B 9/02* (2022.01)
*G01B 9/02055* (2022.01)
(Continued)

(52) U.S. Cl.
CPC ..... *G01B 9/02044* (2013.01); *G01B 9/02074* (2013.01); *G01B 11/306* (2013.01); *G01N 21/9501* (2013.01); *H01L 21/67288* (2013.01)

(58) Field of Classification Search
CPC .............. G01B 11/306; G01B 9/02044; G01B 9/02074; G01B 11/2441; G01N 21/9501; H01L 21/67288; H01L 21/67242–67294
See application file for complete search history.

(56) References Cited

U.S. PATENT DOCUMENTS 9,490,182 B2 * 11/2016 Shchegrov .......... G03F 7/70141
9,816,810 B2 * 11/2017 Shchegrov .......... G03F 7/70141
(Continued)

FOREIGN PATENT DOCUMENTS

| CN | 1784588 A | 6/2006 |
|---|---|---|
| CN | 101221136 A | 7/2008 |

(Continued)

OTHER PUBLICATIONS

International Search Report issued in corresponding International Application No. PCT/CN2020/076434, dated Nov. 30, 2020, 4 pages.

(Continued)

*Primary Examiner* — Violeta A Prieto
(74) *Attorney, Agent, or Firm* — Bayes PLLC

(57) ABSTRACT

Embodiments of systems for classifying interference signals are disclosed. In an example, a system for classifying interference signals includes an interferometer including a light source and a detector, and at least one processor. The interferometer is configured to provide a plurality of interference signals each corresponding to a respective one of a plurality of positions on a surface of a semiconductor chip. A spectrum of the light source is greater than a spectrum of white light. The at least one processor is configured to classify the interference signals into a plurality of categories using a model. Each of the categories corresponds to a region having a same material on the surface of the semiconductor chip.

20 Claims, 26 Drawing Sheets

(51) Int. Cl.
*G01B 11/30* (2006.01)
*G01N 21/95* (2006.01)
*H01L 21/67* (2006.01)

(56) References Cited

U.S. PATENT DOCUMENTS

| | | | |
|---|---|---|---|
| 9,906,278 B2 | 2/2018 | Amini et al. | |
| 9,915,524 B2* | 3/2018 | Sapiens | G03F 7/70625 |
| 10,386,311 B1 | 8/2019 | Shoham et al. | |
| 10,612,916 B2* | 4/2020 | Shchegrov | H01L 22/30 |
| 10,648,796 B2* | 5/2020 | Sapiens | G01B 11/24 |
| 11,131,629 B2* | 9/2021 | Sezginer | G01J 1/44 |
| 11,243,067 B2* | 2/2022 | Wang | G01B 11/2441 |
| 2005/0078318 A1* | 4/2005 | De Groot | G01B 9/02019 |
| | | | 356/497 |
| 2005/0078319 A1* | 4/2005 | De Groot | G01B 9/02022 |
| | | | 356/497 |
| 2006/0176522 A1 | 8/2006 | Mansfield et al. | |
| 2006/0262321 A1* | 11/2006 | De Groot | G01B 11/2441 |
| | | | 356/503 |
| 2007/0046953 A1 | 3/2007 | De Groot et al. | |
| 2008/0068614 A1* | 3/2008 | De Groot | G03F 7/70775 |
| | | | 356/497 |
| 2008/0140341 A1 | 6/2008 | Ralston et al. | |
| 2009/0096980 A1* | 4/2009 | De Groot | G01B 9/02019 |
| | | | 349/189 |
| 2009/0182528 A1 | 7/2009 | De Groot et al. | |
| 2010/0060898 A1* | 3/2010 | De Groot | G03F 9/7088 |
| | | | 356/497 |
| 2010/0094135 A1* | 4/2010 | Fang-Yen | G01B 9/02057 |
| | | | 600/476 |
| 2012/0320380 A1 | 12/2012 | Schönleber et al. | |
| 2014/0350887 A1 | 11/2014 | Beitia Caceres et al. | |
| 2015/0160124 A1 | 6/2015 | Ho et al. | |
| 2015/0176985 A1* | 6/2015 | Shchegrov | G03F 7/70141 |
| | | | 356/614 |
| 2016/0109230 A1 | 4/2016 | Pandev et al. | |
| 2016/0245758 A1 | 8/2016 | Liu et al. | |
| 2016/0334326 A1* | 11/2016 | Sapiens | G01B 11/24 |
| 2017/0003123 A1* | 1/2017 | Shchegrov | G01B 11/272 |
| 2017/0016715 A1 | 1/2017 | Heidrich et al. | |
| 2018/0051984 A1* | 2/2018 | Shchegrov | G01B 11/272 |
| 2018/0180406 A1* | 6/2018 | Sapiens | G03F 7/70625 |
| 2018/0340886 A1* | 11/2018 | Sezginer | G03F 1/84 |
| 2019/0191313 A1 | 6/2019 | Dzierwa et al. | |
| 2019/0265023 A1* | 8/2019 | Deck | G01B 9/02075 |
| 2020/0409274 A1* | 12/2020 | Adriaens | G01B 11/002 |
| 2021/0262779 A1* | 8/2021 | Wang | G01B 9/02072 |
| 2021/0262785 A1* | 8/2021 | Wang | G01B 11/2441 |
| 2021/0265185 A1* | 8/2021 | Wang | G01B 11/0608 |
| 2022/0057191 A1* | 2/2022 | Wang | G01B 9/02072 |

FOREIGN PATENT DOCUMENTS

| | | |
|---|---|---|
| CN | 101680749 A | 3/2010 |
| CN | 102620665 A | 8/2012 |
| CN | 102893124 A | 1/2013 |
| CN | 103267494 A | 8/2013 |
| CN | 105526874 A | 4/2016 |
| CN | 105632956 A | 6/2016 |
| CN | 105674911 A | 6/2016 |
| CN | 105684127 A | 6/2016 |
| CN | 105900016 A | 8/2016 |
| CN | 106352789 A | 1/2017 |
| CN | 107144235 A | 9/2017 |
| CN | 107683400 A | 2/2018 |
| CN | 108061529 A | 5/2018 |
| CN | 108844492 A | 11/2018 |
| CN | 108875072 A | 11/2018 |
| CN | 109073355 A | 12/2018 |
| CN | 109373918 A | 2/2019 |
| CN | 109387155 A | 2/2019 |
| CN | 109781633 A | 5/2019 |
| CN | 109791896 A | 5/2019 |
| CN | 109916330 A | 6/2019 |
| CN | 109932708 A | 6/2019 |
| CN | 110207609 A | 9/2019 |
| CN | 110260814 A | 9/2019 |
| CN | 110285771 A | 9/2019 |
| CN | 110301038 A | 10/2019 |
| CN | 110487205 A | 11/2019 |
| CN | 110686166 A | 1/2020 |
| CN | 110779464 A | 2/2020 |
| GB | 2188763 B | 1/1989 |
| JP | 2002081916 A | 3/2002 |
| JP | 2006170847 A | 6/2006 |
| JP | 4133753 B2 | 8/2008 |
| JP | 2016001143 A | 1/2016 |
| JP | 2018124184 A | 8/2018 |
| KR | 101653908 B1 | 9/2016 |
| TW | 200730796 A | 8/2007 |
| TW | 200809945 A | 2/2008 |
| TW | 201643414 A | 12/2016 |
| TW | 201728868 A | 8/2017 |
| TW | 201907228 A | 2/2019 |
| TW | 201917492 A | 5/2019 |
| TW | 201923305 A | 6/2019 |
| TW | 201940833 A | 10/2019 |
| TW | 201942942 A | 11/2019 |

OTHER PUBLICATIONS

Written Opinion of the International Searching Authority issued in corresponding International Application No. PCT/CN2020/076434, dated Nov. 30, 2020, 4 pages.

International Search Report issued in corresponding International Application No. PCT/CN2020/076431, dated Nov. 20, 2020, 3 pages.

Written Opinion of the International Searching Authority issued in corresponding International Application No. PCT/CN2020/076431, dated Nov. 20, 2020, 4 pages.

International Search Report issued in corresponding International Application No. PCT/CN2020/076432, dated Nov. 24, 2020, 3 pages.

Written Opinion of the International Searching Authority issued in corresponding International Application No. PCT/CN2020/076432, dated Nov. 24, 2020, 4 pages.

International Search Report issued in corresponding International Application No. PCT/CN2020/076430, dated Nov. 27, 2020, 4 pages.

Written Opinion of the International Searching Authority issued in corresponding International Application No. PCT/CN2020/076430, dated Nov. 27, 2020, 4 pages.

* cited by examiner

2100

SYSTEMS HAVING LIGHT SOURCE WITH EXTENDED SPECTRUM FOR SEMICONDUCTOR CHIP SURFACE TOPOGRAPHY METROLOGY

CROSS-REFERENCE TO RELATED APPLICATIONS

This application is a continuation of International Application No. PCT/CN2020/076430, filed on Feb. 24, 2020, entitled "SYSTEMS HAVING LIGHT SOURCE WITH EXTENDED SPECTRUM FOR SEMICONDUCTOR CHIP SURFACE TOPOGRAPHY METROLOGY," which is hereby incorporated by reference in its entirety. This application is also related to U.S. application Ser. No. 16/910,667, filed on Jun. 24, 2020, entitled "SYSTEMS AND METHODS FOR SEMICONDUCTOR CHIP SURFACE TOPOGRAPHY METROLOGY," U.S. application Ser. No. 16/910,650, filed on Jun. 24, 2020, entitled "SYSTEMS AND METHODS FOR SEMICONDUCTOR CHIP SURFACE TOPOGRAPHY METROLOGY," and U.S. application Ser. No. 16/910,691, filed on Jun. 24, 2020, entitled "SYSTEMS AND METHODS FOR SEMICONDUCTOR CHIP SURFACE TOPOGRAPHY METROLOGY," all of which are hereby incorporated by reference in their entireties.

BACKGROUND

Embodiments of the present disclosure relate to metrology systems and methods in semiconductor manufacturing.

Surface topography is an important surface property, and it affects the performance of semiconductor products as well as their fabrication processes. For example, the wafer bonding process has been increasingly used to achieve innovative stacking structures in semiconductor devices. Topography, which defines the flatness of the wafer surface, is one of the most key factors to achieve a good bonding result. A successful bonding process requires ultra-precise alignment of two wafers, as well as planarization of the bonding interface. For example, interface topographic defects can cause wafer edge die open issues during the bonding processes, thereby causing serious yield loss or downgrade ratio.

SUMMARY

Embodiments of systems for classifying interference signals are disclosed herein.

In one example, a system for classifying interference signals includes an interferometer including a light source and a detector, and at least one processor. The interferometer is configured to provide a plurality of interference signals each corresponding to a respective one of a plurality of positions on a surface of a semiconductor chip. A spectrum of the light source is greater than a spectrum of white light. The at least one processor is configured to classify the interference signals into a plurality of categories using a model. Each of the categories corresponds to a region having a same material on the surface of the semiconductor chip.

In another example, a system for classifying interference signals includes an interferometer including a light source and a detector, and at least one processor. The interferometer is configured to provide a plurality of interference signals each corresponding to a respective one of a plurality of positions on a surface of a semiconductor chip. Each of the interference signals includes an interference fringe having a width not greater than about 2 µm. The at least one processor is configured to classify the interference signals into a plurality of categories using a model. Each of the categories corresponds to a region having a same material on the surface of the semiconductor chip.

In still another example, a system for classifying spectrum signals includes an interferometer including a light source and a detector, and at least one processor. The interferometer is configured to provide a plurality of interference signals each corresponding to a respective one of a plurality of positions on a surface of a semiconductor chip. A spectrum of the light source is greater than a spectrum of white light. The at least one processor is configured to transform the plurality of interference signals into a plurality of spectrum signals each corresponding to the respective one of the positions on the surface of the semiconductor chip, and classify the spectrum signals into a plurality of categories using a model. Each of the categories corresponds to a region having a same material on the surface of the semiconductor chip.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
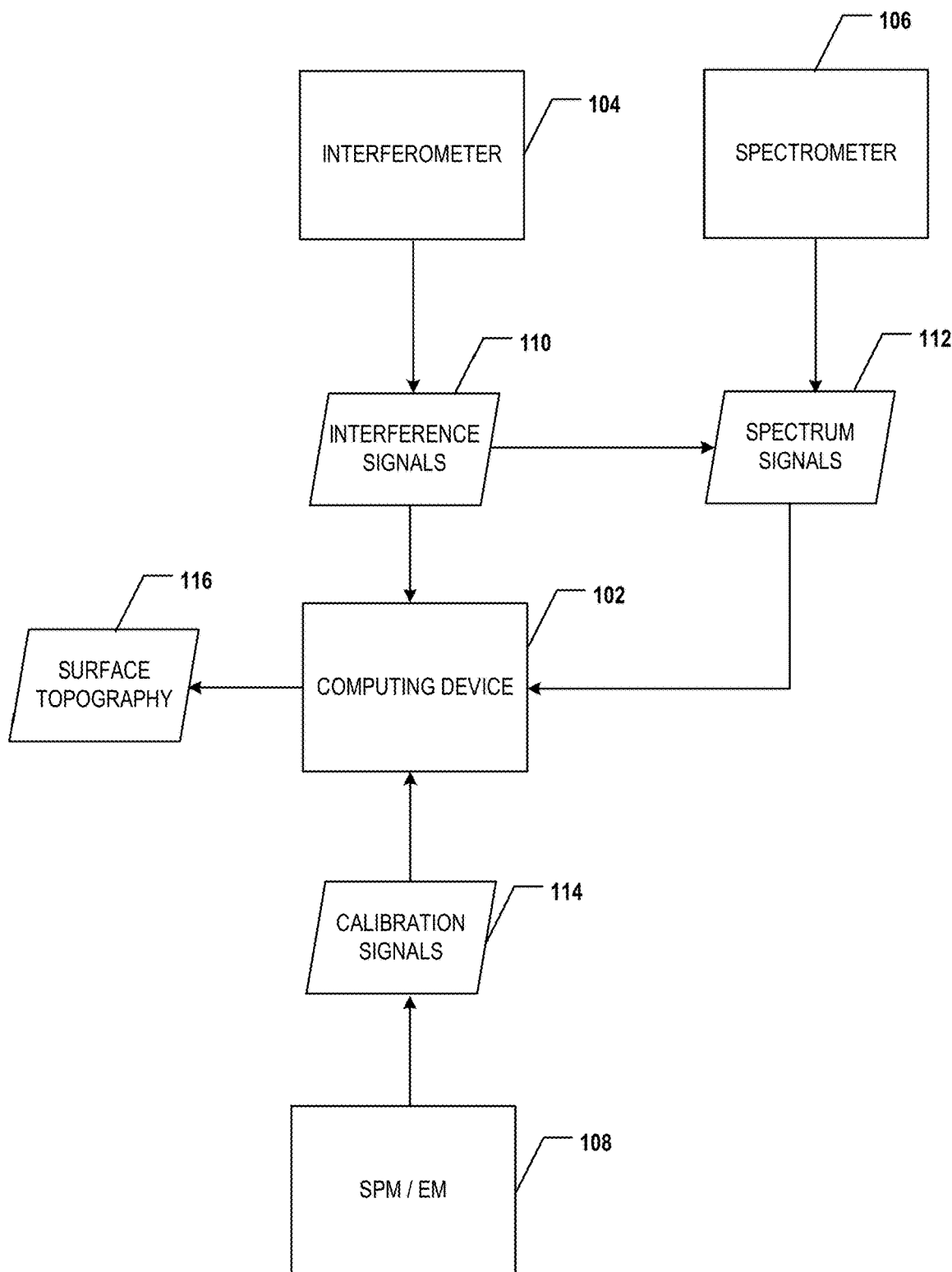
FIG. 1 illustrates a schematic diagram of an exemplary system for measuring the surface topography of a semiconductor chip, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

Atomic force microscopy (AFM) is one of the common methods for topography measurement. However, it suffers from low throughput, which severely constrains AFM's inline usage and also limits troubleshooting efficiency and learning cycle frequency. Another category of topography metrology includes electron microscopy, such as scanning electron microscopy (SEM) or transmission electron microscopy (TEM), which suffers from long cycle time and wafer consumption. Also because of the actual topography can be within 100 nm in some situations, but the measurement range can be at the micrometer level, SEM/TEM is not reliable due to more than 1,000 times of X/Y ratio.

Compared with AFM and SEM/TEM, white light interferometry (WLI) is a more practical and efficient method for topography characterization, of whose throughput can be more than 100 times higher than AFM, and it also enables die-level large area measurement. WLI, unlike laser-based interferometry, is featured of a signal envelope in the spatial domain to show the exact and resolvable height information from a certain reflective surface. However, the accuracy and precision of the conventional WLI approach for wafer surface topography measurements are lower than those of AFM.

Various embodiments in accordance with the present disclosure provide efficient systems and methods of inline surface topography metrology with high throughput suitable for semiconductor chip mass production while still maintaining sufficient accuracy and precision. According to some aspects of the present disclosure, signals from optical measurements, such as interference signals or spectrum signals, combined with machine learning models, can enable high throughput, inline measurement of semiconductor chip surface topography without the necessity of opaque film deposition and consumption of product wafers. In some embodiments, interference signals, such as low coherent interference infringes, are classified into several categories (e.g., using machine learning), each of which is added with a respective surface height offset calibrated from another measurement, for example, AFM or SEM/TEM. As a result, calibrated surface heights (and a calibrated height map therefrom in some cases) of a semiconductor chip having multiple layers can be readily attained with high accuracy and precision. In some embodiments, spectrum signals, such as reflectance spectrums which contain the sample's material and structure information, are obtained either directly from a spectrometer or indirectly from interference signals (e.g., using Fourier transform) can be similarly classified into several categories (e.g., using another machine learning model), each of which is added with its intrinsic surface height offset calibrated from, for example, AFM or SEM/TEM measurement.

According to some aspects of the present disclosure, the light source spectrum can be manipulated, such as being extending to a wider range (e.g., using a Xe lamp), with minimum or no change to the optical elements and detector of the system. A larger range of spectrum would yield narrower signals. The width of the low coherent interference fringe can thus be reduced, thereby improving the signal-to-noise ratio (SNR) and repeatability of the surface topography measurement. As a result, the overlap-free zone (i.e., film thickness) of the test sample can be extended since the thickness requirement can be reduced by the extended light source spectrum.

FIG. 1 illustrates a schematic diagram of an exemplary system 100 for measuring the surface topography of a semiconductor chip, according to some embodiments of the present disclosure. System 100 can include a computing device 102 having at least one processor that implements the various functions disclosed herein for measuring surface topography 116 of a semiconductor chip, such as classification using machine learning models, surface height derivation and calibration, and signal transformation. System 100 can also include one or more optical measuring instruments that can provide one or more types of signals sampled from the surface of a semiconductor chip, which are used as the input signals for surface topography characterization by computing device 102. In some embodiments, the optical measuring instruments of system 100 include an interferometer 104 configured to provide a plurality of interference signals 110 each corresponding to a respective one of a plurality of positions on the surface of a semiconductor chip. In some embodiments, the optical measuring instruments of system 100 also include a spectrometer 106 configured to provide a plurality of spectrum signals 112 each corresponding to a respective one of the plurality of positions on the surface of the semiconductor chip. That is, a plurality of positions on the surface of a semiconductor chip can be sampled, and interference signals 110 and spectrum signals 112 sampled from those positions can be obtained by interferometer 104 and spectrometer 106, respectively. It is understood that in some embodiments, spectrometer 106 may not be included in system 100. In one example, interference signals 110, but not spectrum signals 112, may be used as the input signals of computing device 102. In another example, interference signals 110 may be transformed into spectrum signals 112, and both interference signals 110 and spectrum signals 112 may be used as the input signals of computing device 102.

Figure 2A:
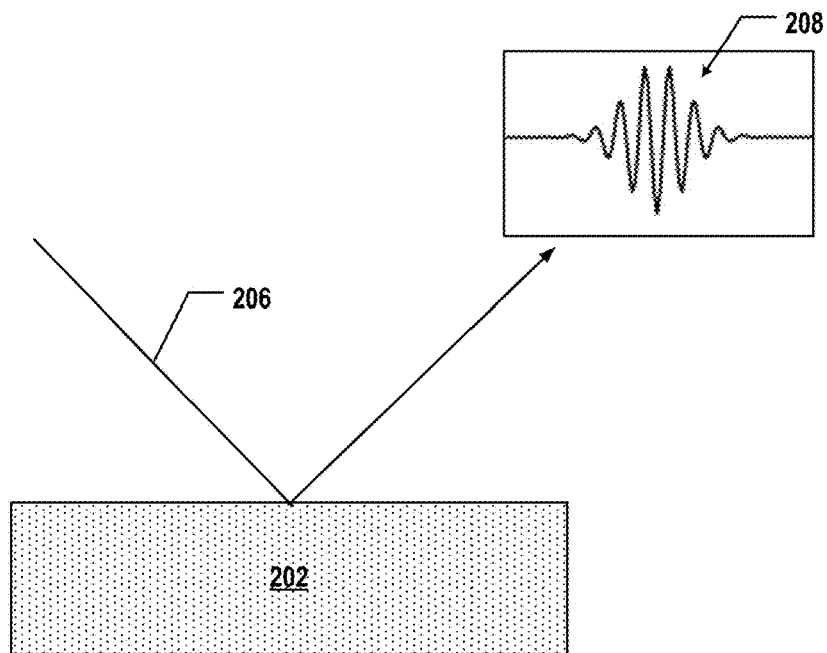
FIG. 2A illustrates a cross-section of an exemplary semiconductor chip without a transparent layer and an interference signal obtained therefrom, according to some embodiments of the present disclosure.

FIG. 2A illustrates a cross-section of an exemplary semiconductor chip 202 without a transparent layer and an interference signal obtained therefrom, according to some embodiments of the present disclosure. The interference signal can be obtained by, for example, interferometer 104 of system 100 in FIG. 1 using interferometry. Interferometry is a family of techniques in which waves, usually electromagnetic waves, are superimposed, causing the phenomenon of interference, which is used to extract information.

Interferometers are widely used in science and industry for the measurement of small displacements, refractive index changes, and surface irregularities. In interferometers, light from a single source can be split into two beams that travel in different optical paths, which are then combined again to produce interference. The resulting interference signals, such as interference fringes, can provide information about the difference in optical path lengths. As one type of interferometry, low coherent interferometry is a non-contact optical method for surface topography measurement that relies on spectrally-broadband, such as visible-wavelength light (i.e., white light). Low coherent interferometry technology employs low coherence characteristics of for example, white light to generate interference waves by reflecting light from the sample surface and a reference surface through a beam splitter which, in turn, is used to get the surface profile based on the optical path difference.

As shown in FIG. 2A, the sample is semiconductor chip 202, and a white light 206 is illuminated at a position on the surface of semiconductor chip 202 and is reflected from the surface of semiconductor chip 202. Semiconductor chip 202 can include a logic device chip, such as a central processing unit (CPU), a graphics processing unit (GPU), an application processor (AP), a programmable logic device (PLD), or a microcontroller unit (MCU), a memory device chip, such as Flash memory, dynamic random-access memory (DRAM), or static random-access memory (SRAM), or any other suitable semiconductor chips. It is understood that semiconductor chip 202 is not limited to the final product and may include any intermediate structures during the fabrication processes or a bare wafer. For example, semiconductor chip 202 may include wafers to be bonded before a bonding process, such as hybrid bonding. As used herein, a "wafer" is a piece of a semiconductor material for semiconductor devices to build in and/or on it and that can undergo various fabrication processes before being separated into dies. A bare wafer is a wafer in its original form before undergoing any fabrication process. The wafer can include silicon (e.g., single crystalline silicon), silicon germanium (SiGe), gallium arsenide (GaAs), germanium (Ge), silicon on insulator (SOI), or any other suitable materials. In one example, the wafer may be a silicon wafer. Nevertheless, the surface topography of semiconductor chip 202 needs to be measured for quality control before, during, or after the fabrication process, according to some embodiments.

In some embodiments, the position at which white light 206 is illuminated in FIG. 2A is in an opaque layer, such as the surface of a silicon substrate or any layers formed on the silicon substrate with opaque materials including, for example, metals (e.g., copper, tungsten, cobalt, etc.), polysilicon, to name a few. An interference signal corresponding to the position in an opaque layer at the surface of semiconductor chip 202 includes an interference fringe 208 (also known as a "signal envelope") of low coherent interferometry, which shows how the superimposed signals for the constituent wavelengths result in high fringe contrast at the point where all the patterns agree in phase—the so-called stationary phase position, according to some embodiments. The surface height at the position can thus be resolved and derived from interference fringe 208 of the interference signal. In other words, the interference signal is associated with the original surface height at the position, according to some embodiments.

Figure 2B:
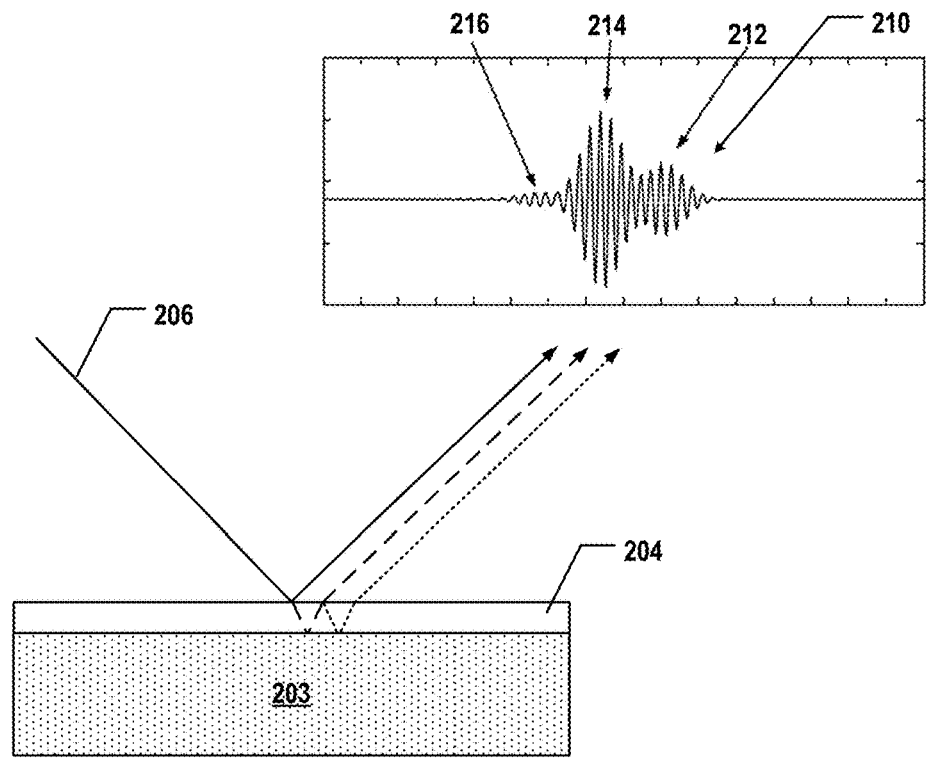
FIG. 2B illustrates a cross-section of another semiconductor chip with a transparent layer and another interference signal obtained therefrom, according to some embodiments of the present disclosure.

A more challenging case is a sample coated with transparent thin-film layers. FIG. 2B illustrates a cross-section of another exemplary semiconductor chip 203 with a transparent layer 204 and another interference signal obtained therefrom, according to some embodiments of the present disclosure. It is understood that in some embodiments, semiconductor chip 203 may be the same chip as semiconductor chip 202, while white light 206 is illuminated at a different position in transparent layer 204, such as the surface of a glass substrate or any layers formed on a silicon or glass substrate with transparent materials including, for example, silicon oxide or silicon nitride.

As shown in FIG. 2B, white light 206 is reflected at various interfaces, such as the top surface of transparent layer 204, the top surface of the opaque layer (e.g., the substrate surface), as well as an echo resulting from the internal reflection between the top surface and the substrate surface, according to some embodiments. As a result, another interference signal corresponding to the position in transparent layer 204 at the surface of semiconductor chip 203 includes another interference fringe 210 of low coherent interferometry. Different from interference fringe 208 in FIG. 2A, interference fringe 210 can include three components: a top surface reflection component 212 corresponding to the top surface of transparent layer 204, a substrate component 214 corresponding to the substrate of semiconductor chip 203, and an internal reflection component 216 corresponding to the echo resulting from the internal reflection. Compared with the interference signal corresponding to a position in an opaque layer, the interference signal corresponding to a position in a transparent layer has a more complex interference fringe from which a surface height may not be accurately and precisely resolved. That is, for semiconductor chips with multiple layers, in particular one or more transparent layers, the incoherent superposition interference signal includes summing the interference contributions of light intensity from multiple layers, which may not be suitable for direct derivation of surface height information therefrom. As described below in detail, machine learning models run by computing device 102 can filter the complication of the input signals, such as interference signals having multi-component interference fringe, into categories without knowing the actual structure, thereby improving the accuracy and precision of surface topography measurement.

Figure 3A:
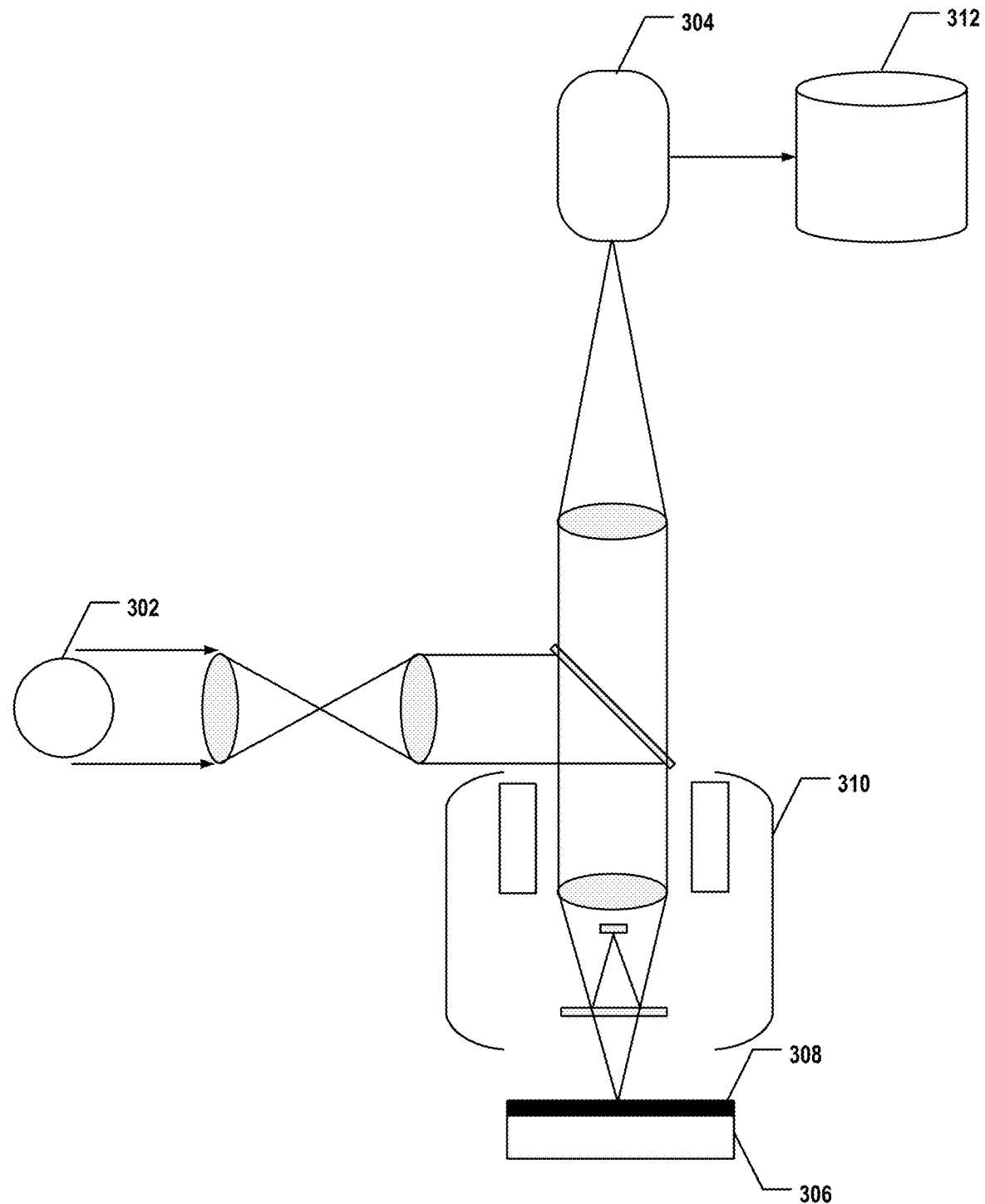
FIG. 3A illustrates a diagram of an exemplary interferometer, according to some embodiments of the present disclosure.

FIG. 3A illustrates a diagram of an exemplary interferometer 300, according to some embodiments of the present disclosure. Interferometer 300 may be one example of interferometer 104 in FIG. 1, such as a low coherent interferometer. Interferometer 300 can include a light source 302, a detector 304, a sample holder 306 holding a sample 308, and a scanner 310. In some embodiments, interferometer 300 is a white-light interferometric microscope, which combines an interferometer with the optics of a microscope including, for example, tube lens, condenser lens, beam splitter, objective lens mirrors, etc. Scanner 310 can be an accurate positioning stage (e.g., a piezoelectric actuator) configured to move the objective (e.g., a Mirau objective) vertically. The interference signal of a pixel has maximum modulation when the optical path length of light impinging on the pixel is the same for the reference and the object beams, according to some embodiments. As such, the surface height of the position on the surface of sample 308 by this pixel corresponds to the z-value of scanner 310 when the modulation of the correlogram is the greatest. It is understood that although interferometer 300 is illustrated as a Mirau interferometer having a Mirau objective, interferometer 300 may be any other suitable types of interferometers, such as a Twyman-Green interferometer having a Twyman-Green objective. It is further understood that in some embodiments, a database 312 may be connected to detector 304 to store the interference signals or any other information associated with the interference signals, such as the original surface heights derived from the interference signals, for future processing.

Light source 302 can include any suitable light sources for low coherent interferometry. In some embodiments, light source 302 includes a white light source including, but not limited to incandescent lamps (e.g., tungsten-halogen lamps), fluorescent lamps, and white light light-emitting diodes (LEDs). The range of wavelengths of the spectrum of light source 302 can be between about 400 nm and about 900 nm, such as between 400 nm and between 900 nm. In some embodiments, the range of wavelengths of the spectrum of light source 302 is the same range of wavelengths of the spectrum of white light (also known as "visible spectrum"), e.g., between about 400 nm and about 700 nm, such as between 400 nm and 700 nm. FIG. 4A illustrates exemplary constituent lights of a white light source, according to some embodiments of the present disclosure. The constituent lights of a white light source can include red, green, and blue lights as shown in FIG. 4A. In some embodiments, the constituent lights may further include violet, cyan, yellow, and orange lights.

Figure 4B:
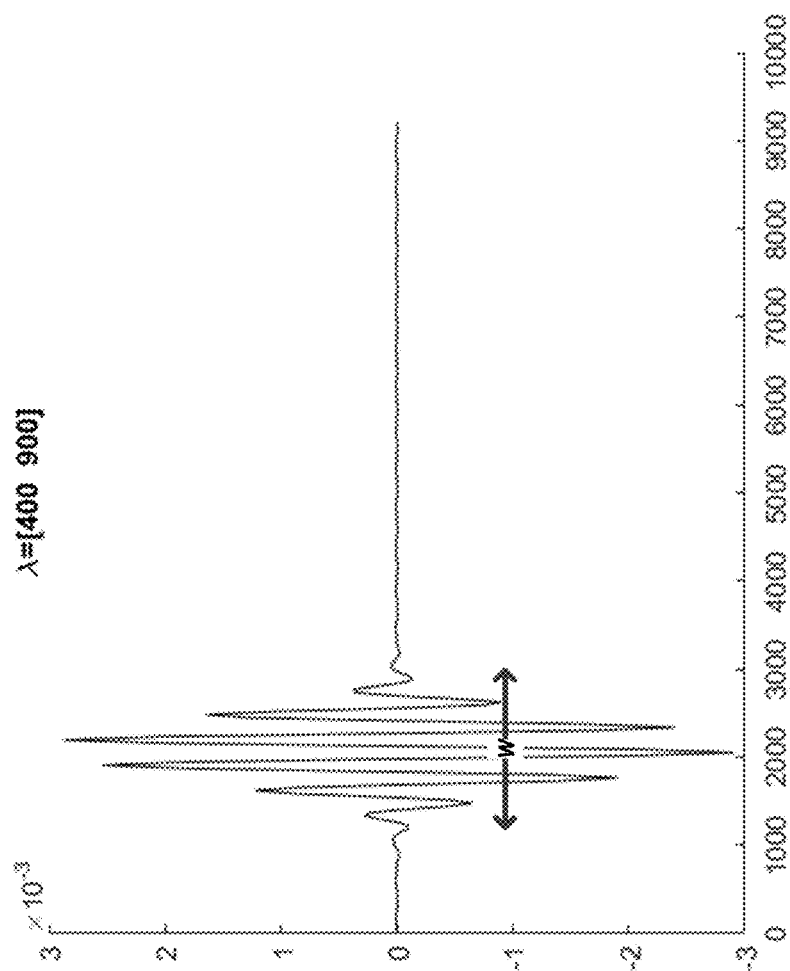
FIG. 4B illustrates an exemplary interference signal generated by the constituent lights of the white light source in FIG. 4A, according to some embodiments of the present disclosure.
Figure 4A:
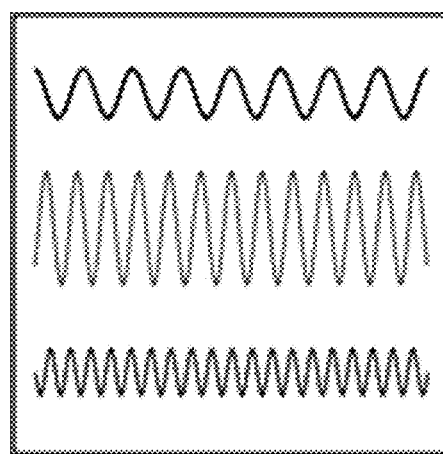
FIG. 4A illustrates exemplary constituent lights of a white light source, according to some embodiments of the present disclosure.

FIG. 4B illustrates an exemplary interference signal generated by the constituent lights of the white light source in FIG. 4A, according to some embodiments of the present disclosure. In this example, the range of wavelengths of the spectrum of the white light source is between 400 nm and 900 nm, and the x-axis and y-axis represent the z-value of the scanner and the interference signal strength, respectively. As shown in FIG. 4B, the interference signal includes an interference fringe having the width w of about 2 μm. It is understood that when the interference signal corresponds to a position in a transparent layer at the sample surface, multiple components of the interference fringe may be overlapped (superposition) to increase the width of the interference fringe and/or have multiple peaks (e.g., 210 in FIG. 2B), which lowers the SNR compared to theoretical Gaussian distribution. For both direct derivation of surface height and classification using machine learning, a narrower and simpler interference fringe (e.g., having a single narrow peak) in an interference signal is preferred as it has the higher SNR, vertical resolution, and repeatability, which in turn can be used to measure the surface topography of a semiconductor chip having a thinner transparent layer.

Referring back to FIG. 3A, the spectrum of light source 302 can be extended to a wider range in order to reduce the width of the interference fringe of the interference signal as the width of the interference fringe depends on the spectrum width of light source 302, thereby improving the SNR, vertical resolution, and repeatability of the interference signal. Moreover, the overlap-free zone (e.g., transparent layer thickness) can be in turn extended since the thickness requirement can be reduced accordingly. In some embodiments, the spectrum of light source 302 is greater than the spectrum of white light. For example, the spectrum of light source 302 may further include at least one of ultraviolet (UV) light or infrared (IR) light. In some embodiments, the range of wavelengths of the spectrum of light source 302 is greater than the range between about 400 nm and about 700 nm (e.g., visible spectrum), such as greater than the range between 400 nm and 700 nm. That is, the wavelengths of the spectrum of light source 302 can be smaller than 400 nm and/or larger than 700 nm. In some embodiments, the range of wavelengths of the spectrum of light source 302 is greater than the range between about 400 nm and about 900 nm, such as greater than the range between 400 nm and 900 nm. That is, the wavelengths of the spectrum of light source 302 can be smaller than 400 nm and/or larger than 900 nm. In one example, the range of wavelengths of the spectrum of light source 302 may be between about 190 nm and about 1,100 nm, such as between 190 nm and 1,100 nm. Light source 302 can include any suitable light sources that can emit lights having a broader spectrum wavelength range than the white light, for example, metal halide lamps. In some embodiments, light source 302 includes a Xe lamp, such as a Xe arc lamp or a Xe flash lamp.

Accordingly, the interference signal can include an interference fringe having the width not greater than about 2 µm, such as not greater than 2 µm (e.g., 2 µm, 1.9 µm, 1.8 µm, 1.7 µm, 1.6 µm, 1.5 µm, 1.4 µm, 1.3 µm, 1.2 µm, 1.1 µm, 1 µm, 0.9 µm, 0.8 µm, 0.7 µm, 0.6 µm, 0.5 µm, 0.4 µm, 0.3 µm, 0.2 µm, 0.1 µm, any range bounded by the lower end by any of these values, or in any range defined by any two of these values). In some embodiments, the width of the interference fringe is about 1.2 µm, such as 1.2 µm. Consequently, the minimum thickness of the transparent layer on the sample (e.g., a semiconductor device) is not greater than about 2 µm, such as not greater than 2 µm (e.g., 2 µm, 1.9 µm, 1.8 µm, 1.7 µm, 1.6 µm, 1.5 µm, 1.4 µm, 1.3 µm, 1.2 µm, 1.1 µm, 1 µm, 0.9 µm, 0.8 µm, 0.7 µm, 0.6 µm, 0.5 µm, 0.4 µm, 0.3 µm, 0.2 µm, 0.1 µm, any range bounded by the lower end by any of these values, or in any range defined by any two of these values). In some embodiments, the minimum thickness of the transparent layer is about 1.2 µm, such as 1.2 µm.

Figure 5B:
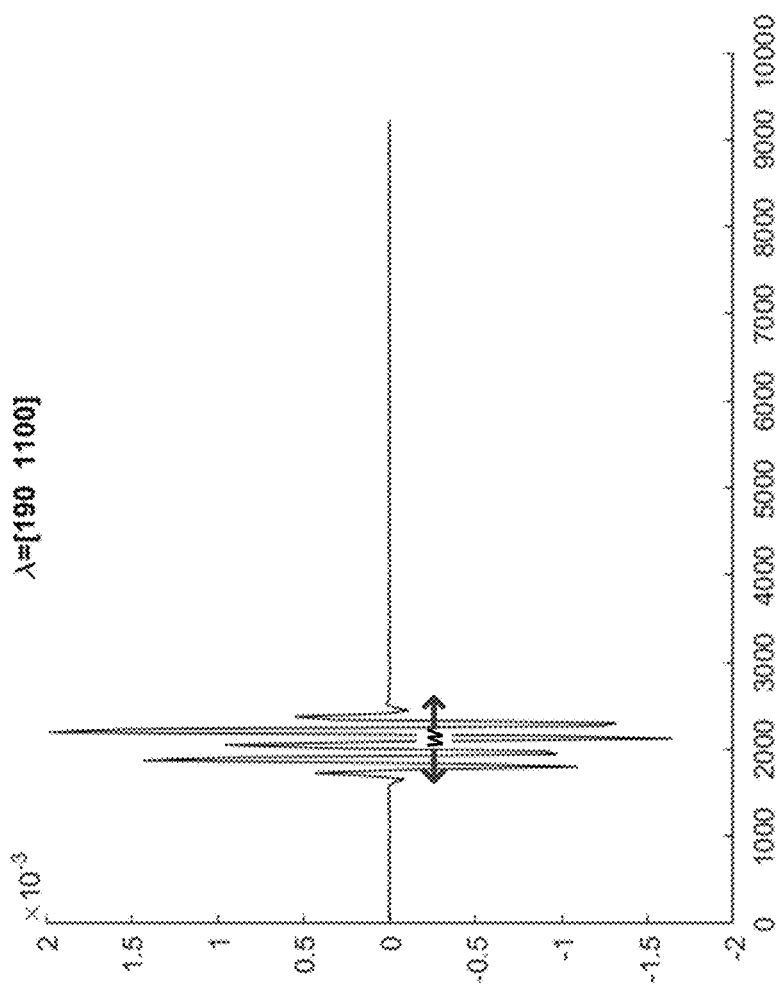
FIG. 5B illustrates an exemplary interference signal generated by the constituent lights of the Xe lamp in FIG. 5A, according to some embodiments of the present disclosure.
Figure 5A:
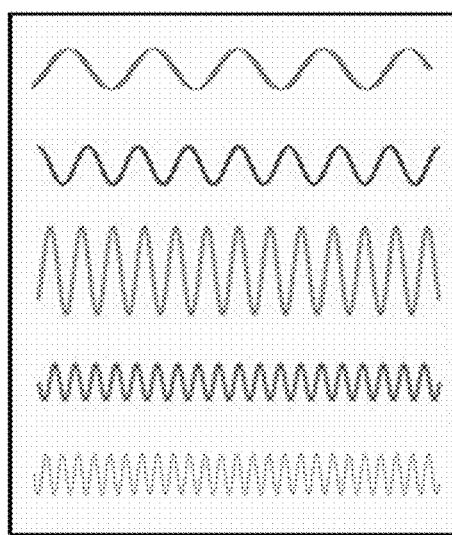
FIG. 5A illustrates exemplary constituent lights of a Xenon (Xe) lamp, according to some embodiments of the present disclosure.

FIG. 5A illustrates exemplary constituent lights of a Xe lamp, according to some embodiments of the present disclosure. The constituent lights of a Xe lamp can include red, green, and blue lights in the white light, as well as UV and IR lights not in the white light. FIG. 5B illustrates an exemplary interference signal generated by the constituent lights of the Xe lamp in FIG. 5A, according to some embodiments of the present disclosure. In this example, the range of wavelengths of the spectrum of the Xe lamp is between 190 nm and 1,100 nm, and the x-axis and y-axis represent the z-value of the scanner and the interference signal strength, respectively. As shown in FIG. 5B, the interference signal includes an interference fringe having the width w of about 1.2 µm. That is, compared with the example shown in FIG. 4B, by extending the wavelength range of the light source spectrum, a narrower interference fringe can be obtained in the interference signal in FIG. 5B, which has the higher SNR, vertical resolution, and repeatability.

Referring back to FIG. 3A, besides spectrum extension at light source 302 to narrow the interference fringe of the interference signal, the interference signal can be manipulated in any other suitable manners, e.g., by combining or subtracting spectrums, to create the desired signal shape for future processing, such as signal classification or direct surface height derivation. In some embodiments, interferometer 300 further includes one or more optical elements configured to manipulate the spectrum of light source 302. The optical elements include at least one of a filter or an antireflection film, according to some embodiments.

In some embodiments, interferometer 300 includes detector 304 suitable for low coherent interferometry. Interference occurs at detector 304 if the optical path lengths of the two arms differ less than half the coherence length of light source 302, according to some embodiments. Each pixel of detector 304 can sample a different position within the image of the surface of sample 308. In some embodiments, detector 304 includes a white light charge-coupled device (CCD) or a white light charge complementary metal-oxide-semiconductor (CMOS) image sensor. The white light CCD or white light CMOS image sensor can be used for detecting light source 302 having a white light spectrum as well as having a Xe lamp spectrum (e.g., between 190 nm and 1,100 nm). That is, the same white light CCD or white light CMOS image sensor can be used as detector 304 regardless of whether light source 302 is a white light source or a Xe lamp.

Figure 3B:
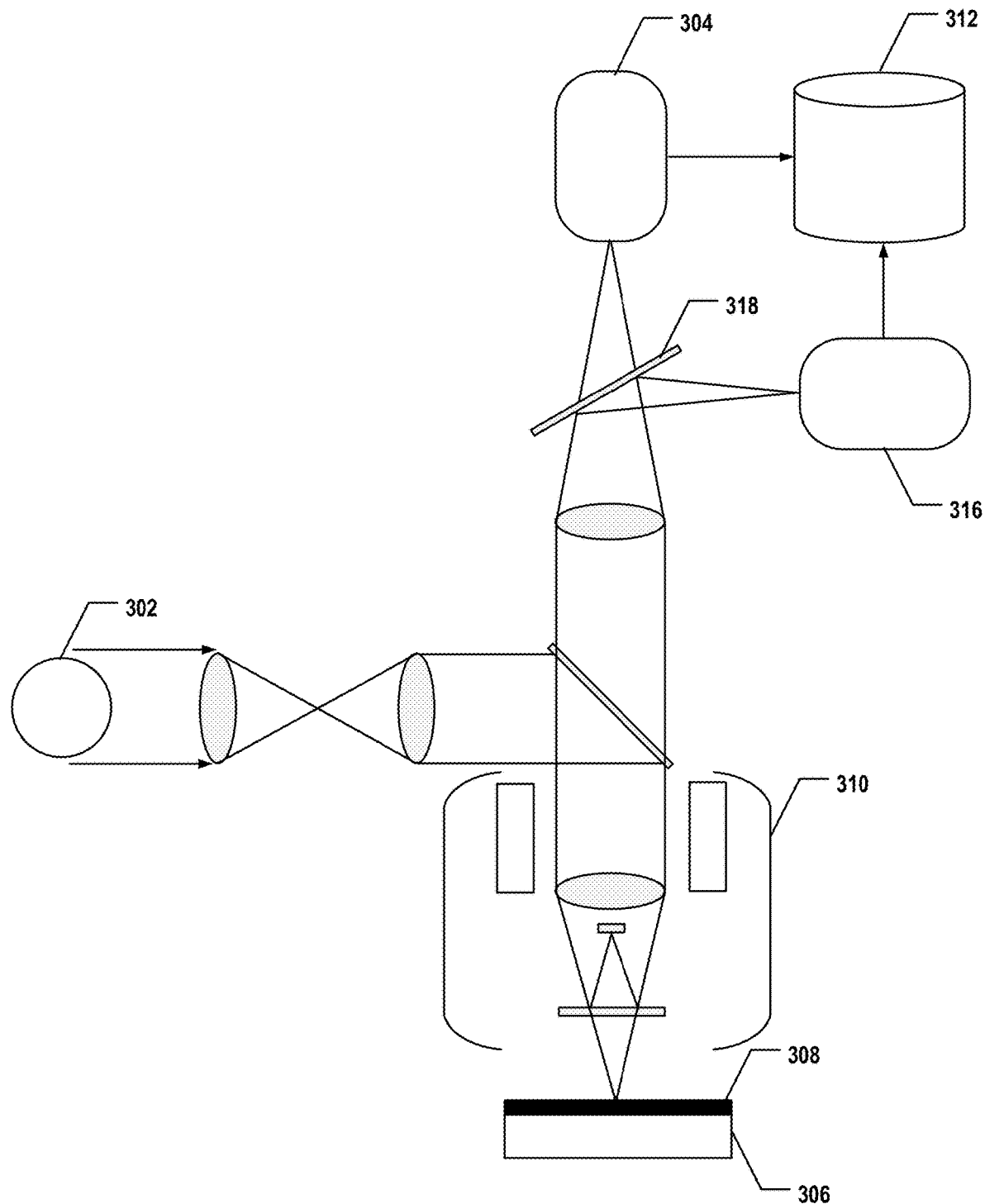
FIG. 3B illustrates a diagram of another exemplary interferometer with a spectrometer, according to some embodiments of the present disclosure.

As described above with respect to FIG. 1, spectrum signals are another type of signals obtained from optical measurements, which can reveal the surface structure and material information. FIG. 3B illustrates a diagram of another exemplary interferometer 301 with a spectrometer 316, according to some embodiments of the present disclosure. Spectrometer 316 may be one example of spectrometer 106 in FIG. 1, such as an optical spectrometer (also known as "spectrophotometer" or "spectroscope"). Compared with interferometer 300 shown in FIG. 3A, another beam splitter 318 and spectrometer 316 can be added interferometer 301 to be able to provide both interference signals and spectrum signals each corresponding to a respective one of a plurality of positions on the surface of sample 308 (e.g., a semiconductor chip). As shown in FIG. 3B, the reference light and reflected object light are split by beam splitter 318 to be transmitted to both detector 304 and spectrometer 316. Spectrometer 316 can include any suitable optical spectrometers that show the intensity of light as a function of wavelength or frequency. An optical spectrometer is an instrument used to measure properties of light over a specific portion of the electromagnetic spectrum. In some embodiments, the variable measured by spectrometer 316 includes reflectance or reflectivity, and each spectrum signal provided by spectrometer 316 includes a reflectance spectrum. The reflectance of the surface of sample 308 is its effectiveness in reflecting radiant energy, which is the fraction of incident electromagnetic power that is reflected at an interface. The reflectance spectrum can represent the reflectance as a function of wavelength, which is associated with the surface structure and material. It is understood that in some embodiments, the spectrum signals provided by spectrometer 316 may be stored in database 312 as well.

Referring back to FIG. 1, the input signals (e.g., interference signals 110 and spectrum signals 112) from the optical measuring instruments (e.g., interferometer 104 and spectrometer 106) of system 100 can be sampled at a higher throughput than the input signals from conventional surface topography measuring instruments, such as AFM and SEM/TEM, without damaging the sample (e.g., a semiconductor chip). To compensate for the low accuracy and precision of surface topography measurement associated with the optical measurements, system 100 can further include a scanning probe microscopy (SPM) or an electron microscope (EM) 108 configured to provide a plurality of calibration signals 114 to computing device 102 for surface height calibration. SPM can include, but not limited to, an AFM or a scanning tunneling microscope (STM). EM can include, but not limited to an SEM or a TEM. SPM/EM 108 can provide surface topography information at higher accuracy and precision, but with lower throughput, which is suitable as the calibration signals instead of the input signals. By combining the input signals (e.g., interference signals 110 or spectrum signals 112) with higher throughput and calibration signals 114 with higher accuracy and precision, system 100 can provide surface topography 116 of a semiconductor chip efficiently and effectively.

Figure 6:
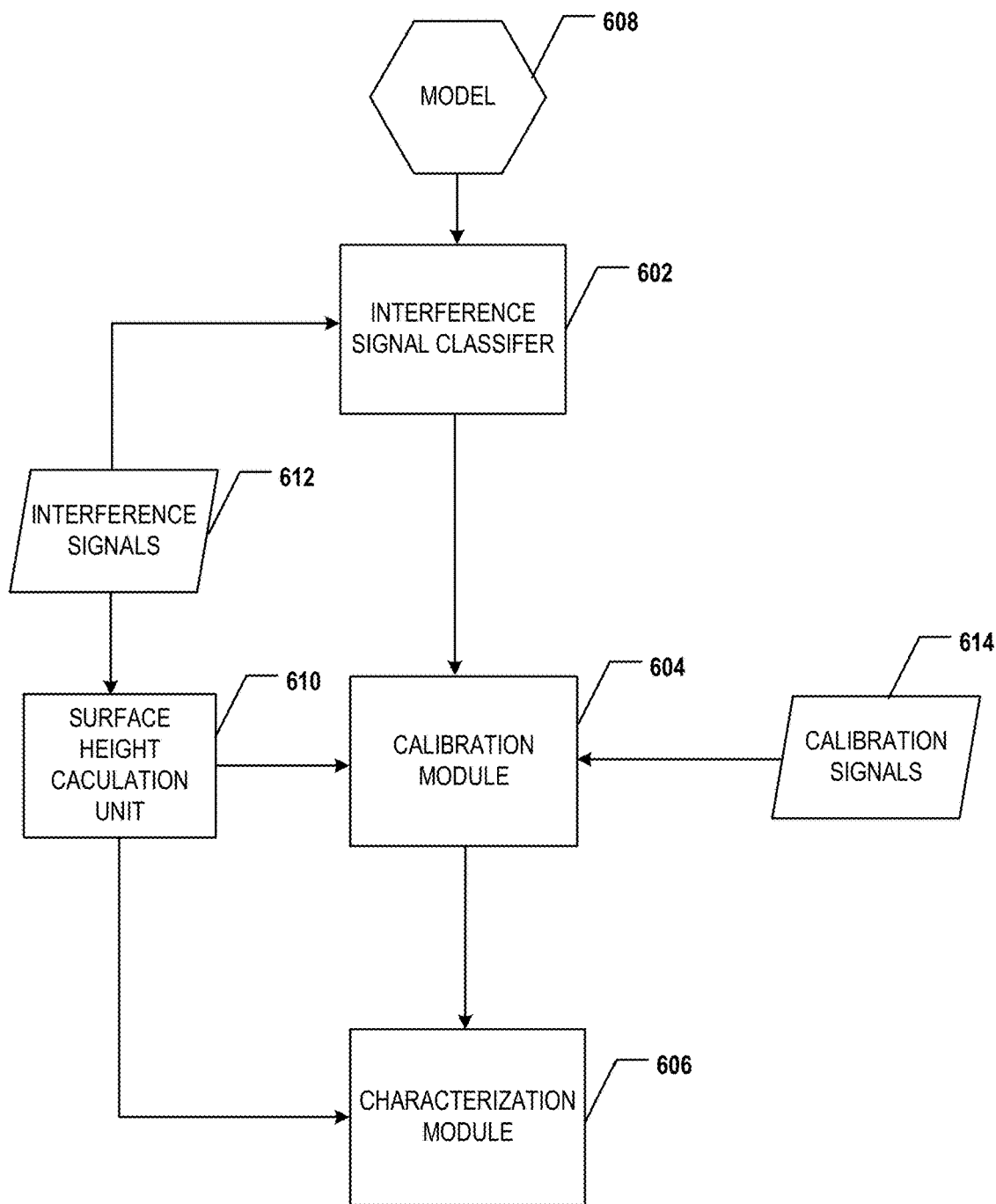
FIG. 6 illustrates a schematic diagram of an exemplary computing device of the system in FIG. 1 for measuring the surface topography of a semiconductor chip, according to some embodiments of the present disclosure.

FIG. 6 illustrates a schematic diagram of an exemplary computing device 600 of system 100 in FIG. 1 for measuring the surface topography of a semiconductor chip, according to some embodiments of the present disclosure. Computing device 600 may be one example of computing device 102 in FIG. 1. Computing device 600 can include a plurality of functional modules and units implemented by at least one processor. In some embodiments, computing device 600 includes an interference signal classifier 602, a calibration module 604, a characterization module 606, and a surface height calculation unit 610. A model 608 for classifying interference signals, run by computing device 600, is used by interference signal classifier 602, according to some embodiments. As described below in detail, model 608 can be a machine learning model trained for classifying interference signals. A plurality of interference signals 612 sampled by interferometer 104 (shown in FIG. 1) are provided as inputs of computing device 600 for classification and surface height calculation, according to some embodiments. In some embodiments, a plurality of calibration signals 614 sampled by SPM/EM 108 (shown in FIG. 1) are also provided as inputs of computing device 600 for post-classification calibration.

In some embodiments, interference signal classifier 602 is configured to receive a plurality of interference signals 612 each corresponding to a respective one of a plurality of positions on a surface of the semiconductor chip. As described above, the surface of a semiconductor chip (e.g., the top surface on which semiconductor devices are formed) can be sampled at various positions at any suitable interval or pitch in a sampling field (e.g., the entire die or a portion thereof) to obtain interference signals 612. As such, each interference signal 612 can correspond to a respective sampling position on the surface. The surface height at each sample position (referred to herein as the "original surface height") can be resolved and derived from respective interference signal 612 as described above. That is, each interference signal 612 is associated with an original surface height at the respective sampling position in the sampling field, according to some embodiments. In some embodiments, each interference signal 612 includes an interference fringe of low coherent interferometry (e.g., 208 in FIG. 2A and 210 in FIG. 2B). The semiconductor chip can include multiple layers. In some embodiments, at least part of the surface of the semiconductor chip includes a transparent layer, such as a silicon oxide layer or a silicon nitride layer. In some embodiments, the sampling field includes the transparent layer. Thus, at least one of interference signals 612 can include a multi-component interference fringe of low coherent interferometry (e.g., 210 in FIG. 2B), i.e., an incoherent superposition signal having interference contributions of light intensity from multiple layers.

In some embodiments, interference signal classifier 602 is further configured to classify interference signals 612 into a plurality of categories using model 608. Each of the categories corresponds to a region having the same material on the surface of the semiconductor chip, according to some embodiments. Model 608 can include a classification model. Classification is the process of predicting the categories (also known as "classes") of given data points, according to some embodiments. In some embodiments, a classification model, implemented by a classification algorithm, includes a mapping function ($f$) from input variables (e.g., interference signals 612) to discrete output variables (e.g., the categories). Model 608 can include, but not limited to, k-nearest neighbor (KNN), case-based reasoning, decision tree, naive Bayes, artificial neural network (ANN), logistic regression, Fisher's linear discriminant, support vector machine (SVM), or perceptron. In some embodiments in which model 608 includes a classification model, as part of the supervised learning, the categories are known and predetermined. For example, each category may correspond to a region having the same material on the surface of the semiconductor chip. That is, based on the design of the semiconductor chip, e.g., the structures and materials in the sampling field, a plurality of categories can be identified and used as the labels for the training as well as the output variables for classification. In one example, a first category may correspond to a first region of silicon oxide (a transparent layer), a second category may correspond to a second region of tungsten (an opaque layer), and a third category may correspond to a third region of silicon substrate (an opaque layer) in the sampling field on the surface of the semiconductor chip.

In some embodiments, model 608 includes a clustering model. Clustering is the task of grouping a set of objects in such a way that objects in the same group (known as a "cluster") are more similar to each other than to those in other clusters. Model 608 can include, but not limited to, linkage clustering, k-means clustering, Gaussian mixture model clustering, or density-based clustering. In some embodiments in which model 608 includes a clustering model, as part of the unsupervised learning, the categories used by interference signal classifier 602 are not predetermined. In some embodiments, interference signal classifier 602 is configured to cluster interference signals 612 into a plurality of clusters using model 608 (e.g., a clustering model) and adjust the clusters to become the categories used by interference signal classifier 602 based, at least in part, on the design of the semiconductor chip, such that each category corresponds to the respective region having the same material. In other words, clusters can be learned first in an unsupervised manner, and the categories can be determined from the clusters in a supervised manner based on, for example, the structures and materials in the sampling field. In one example, a cluster that does not correspond to a region having the same material in the sampling field may be disregarded. In another example, multiple clusters that correspond to the same region having the same material or correspond to different regions have the same material may be merged.

In some embodiments, any suitable feature selection and feature extraction approaches can be applied to interference signals 612 by interference signal classifier 602 to select and/or extract features (e.g., feature vectors), either latent features or patent features, from each interference signal 612 to reduce the complexity and improve the efficiency of the classification process. In one example, model 608 may include KNN, and 10-dimensional feature vectors may be extracted from each interference signal 612 for classification using the KNN model by interference signal classifier 602.

Figure 7A:
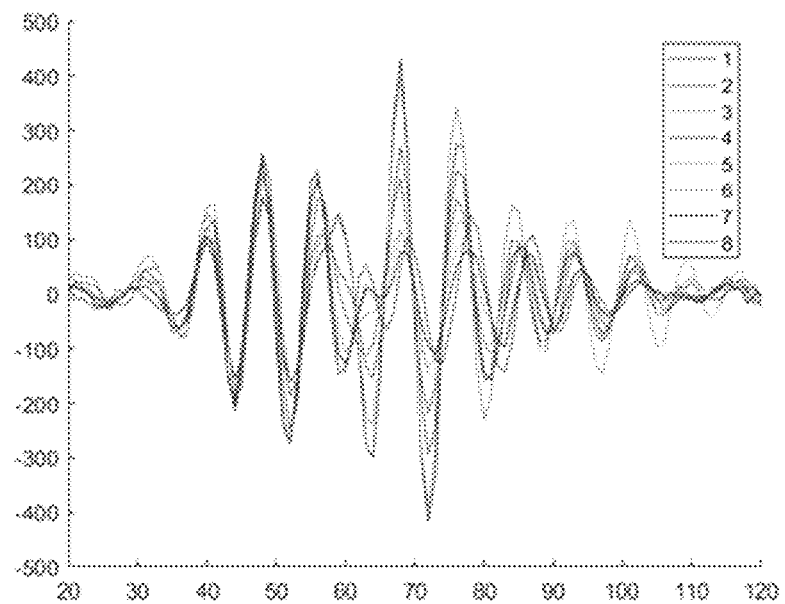
FIG. 7A illustrates exemplary eight interference signals, according to some embodiments of the present disclosure.
Figure 7B:
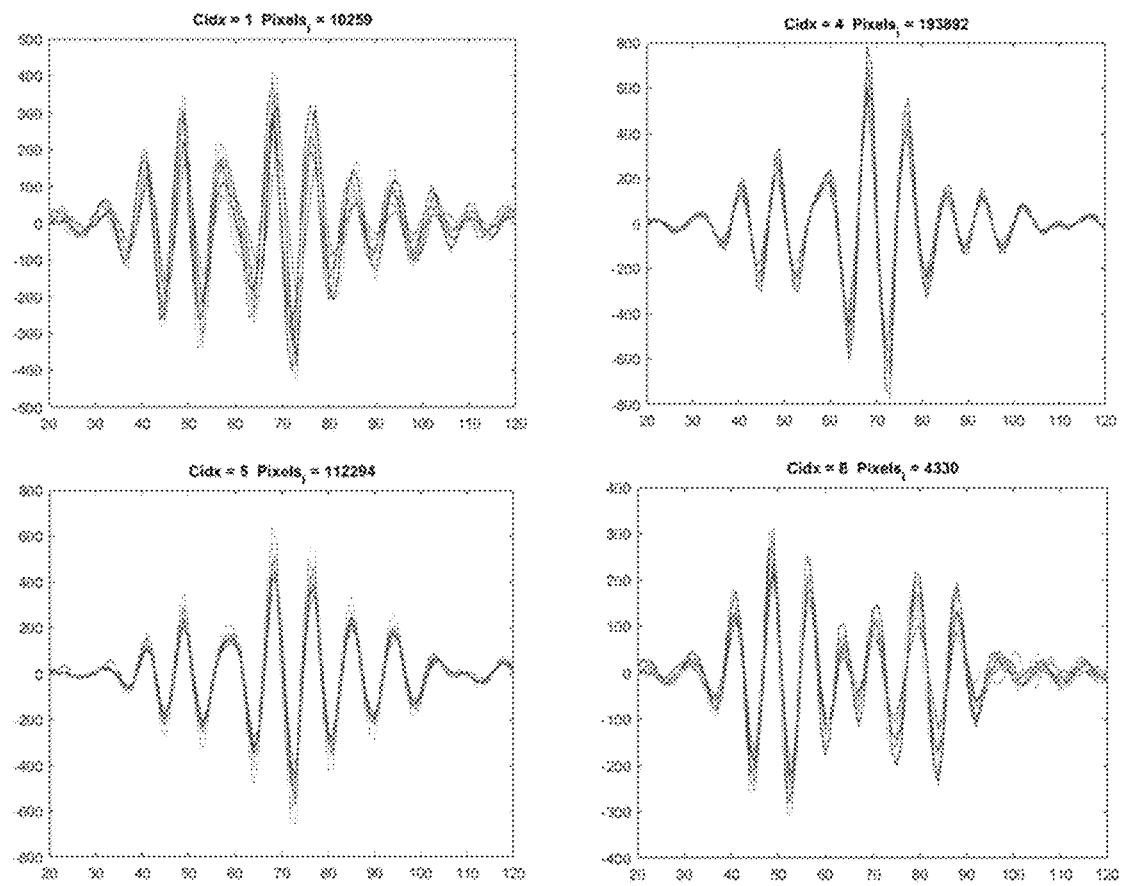
FIG. 7B illustrates the exemplary eight interference signals in FIG. 7A classified into four categories, according to some embodiments of the present disclosure.

FIG. 7A illustrates exemplary eight interference signals, according to some embodiments of the present disclosure. As shown in FIG. 7A, each of the eight interference signals includes a multi-component interference fringe, which corresponds to a respective position in a transparent layer in the sampling field on the sample surface. FIG. 7B illustrates the exemplary eight interference signals in FIG. 7A classified into four categories, according to some embodiments of the present disclosure. Each of the four categories corresponds to a respective region in the sampling field having the same material. The categories can be predetermined or adjusted from a number of clusters determined using a clustering model. The eight interference signals are classified into the four categories using model 608 by interference signal classifier 602, according to some embodiments. As shown in FIG. 7B, each category includes interference signals that have substantially similar interference fringes, which indicates the same material and/or structure at the respective sampling positions.

Referring back to FIG. 6, in some embodiments, calibration module 604 is configured to determine a surface height offset between a surface baseline and at least one of the categories based, at least in part, on a calibration signal 614 associated with the region corresponding to the at least one of the categories. That is, a respective surface height offset can be added to each category based on the same surface baseline for calibration to increase the accuracy and precision of the surface topography. As the first type of inputs, the categories and interference signals 612 classified into each category can be provided by interference signal classifier 602 to calibration module 604. As the second type of inputs, calibration signals 614 can be provided by, for example, SPM/EM 108 (shown in FIG. 1), to calibration module 604. Calibration signals 614 are signals that presumably can provide higher accuracy and precision than interference signals 612 in terms of indicating the surface height information of the sample, but with lower throughput or may damage the sample. In some embodiments, each calibration signal 614 is associated with a topographic height determined by an SPM or an electron microscopy. Depending on the specific instrument providing calibration signals 614, calibration signals 614 can include AFM signals from an AFM, SEM signals from an SEM, or TEM signals from a TEM.

In some embodiments, a third type of inputs—original surface heights are provided to calibration module 604 by surface height calculation unit 610 based on interference signals 612. As described above, each interference signal 612 is associated with an original surface height at the respective position, and surface height calculation unit 610 is configured to derive the original surface height at the respective position in the sampling field by resolving corresponding interference signal 612, according to some embodiments. For example, the z-value (representing the original surface height) for the position on the surface imaged by this pixel may correspond to the z-value of the positioning stage (e.g., scanner 310 in FIGS. 3A and 3B) when the modulation of the correlogram is the greatest (represented by the peak in the interference fringe).

The surface baseline can be preset to any suitable value, such as 0. In some embodiments, to determine the surface height offset, calibration module 604 is configured to designate the surface baseline to a baseline region corresponding to one of the categories. In one example, calibration module 604 may select a region in the sampling field that corresponds to the category having the largest number of interference signals 612 as the baseline region and may designate the surface baseline, e.g., 0, as the surface height offset of the baseline region. In another example, calibration module 604 may select the largest region having the same material in the sampling field as the baseline region and designate the surface baseline, e.g., 0, as the surface height offset of the baseline region. In still another example, calibration module 604 may select the region having a specific material (e.g., silicon substrate region) in the sampling field and designate the surface baseline, e.g., 0, as the surface height offset of the baseline region.

In some embodiments, to determine the surface height offset, calibration module 604 is configured to receive calibration signal 614 and a baseline signal corresponding to the baseline region. In some embodiments, the baseline signals are those calibration signals 614 that are obtained from the baseline region, e.g., the largest region or the silicon substrate region, in the sampling field. For example, SPM/EM 108 may measure calibration signals 614 across multiple regions, including the baseline region, in the sampling field on the surface of a semiconductor chip, and one or more calibration signals 614 corresponding to the baseline region may be used as the baseline signals. The calibration can be performed following a calibration pattern in the sampling field. That is, calibration signals 614, including the baseline signals, can be measured in the calibration pattern, for example, a line or an area across multiple regions, including the baseline region, in the sampling field. Similar to other calibration signals 614, each baseline signal is associated with a topographic height determined by an SPM or an electron microscopy, according to some embodiments.

In some embodiments, to determine the surface height offset, calibration module 604 is configured to determine the surface height offset based, at least in part, on calibration signal 614, the baseline signal, and interference signals 612. In case more than one baseline signal or more than one calibration signal 614 are received, the mean value of multiple baseline signals or the mean value of multiple calibration signals 614 can be used for determining the surface height offset of the corresponding region (and the category associated with the region). It is understood that any other suitable values determined based on multiple baseline signals or calibration signals 614, such as the median value, the maximum value, or the minimum value, may be used for determining the surface height offset of the corresponding region as well. Interference signals 612 that correspond to the positions in the calibration pattern are used for calibration, e.g., determining the surface height offsets. Similarly, in case more than one interference signal 612 is received, the mean value of multiple interference signals 612 can be used for determining the surface height offset of the corresponding region (and the category associated with the region). It is understood that any other suitable values determined based on multiple interference signals 612, such as the median value, the maximum value, or the minimum value may be used for determining the surface height offset of the corresponding region as well.

Figure 8A:
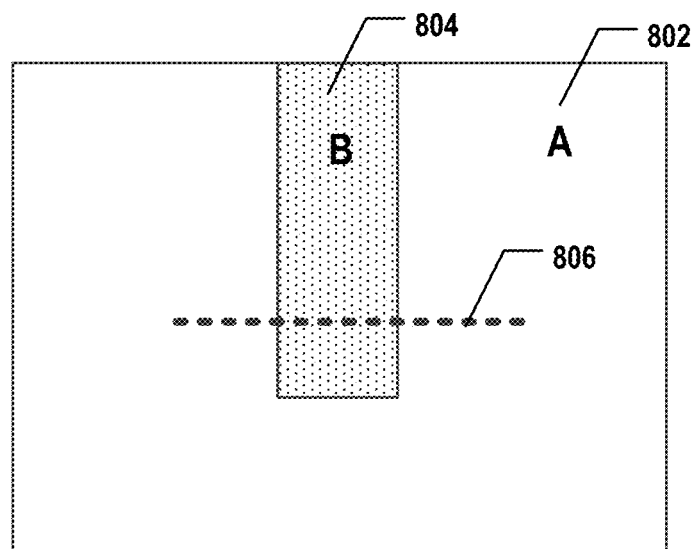
FIGS. 8A and 8B illustrate exemplary processes of surface height offset calibration and calibrated surface height calculation, according to some embodiments of the present disclosure.
Figure 8B:
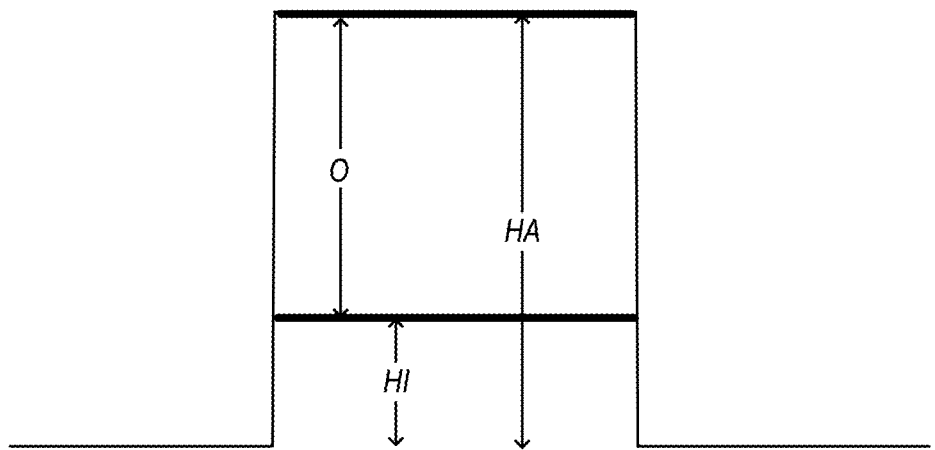

FIGS. 8A and 8B illustrate exemplary processes of surface height offset calibration and calibrated surface height calculation, according to some embodiments of the present disclosure. As shown in FIG. 8A, interference signals 612 may be classified into two categories A and B, each corresponding to a respective region 802 or 804 in the sampling field on the surface of a semiconductor device. Category A may be designated as the baseline region since region 802 is larger than region 804 and/or since region 802 is a silicon substrate region. Calibration may be performed following a calibration pattern 806, e.g., a straight line across both regions 802 and 804, for example, using AFM. Multiple positions in calibration pattern 806 may be sampled to obtain multiple AFM signals, including the baseline signals in region 802. The AFM signals in region 804 may be averaged to obtain a calibration signal of region 804 (category B), and the AFM signals in region 802 may be averaged to obtain a baseline signal of region 802 (category A). The topographic height A of region 802 and the topographic height B of region 804 may be determined based on the average calibration signal and the average baseline signal, respectively.

As shown in FIG. 8B, the difference between topographic height A and topographic height B, i.e., the topographic step height HA, then may be obtained. The difference between original surface height A and original surface height B, i.e., the interference step height HI may be determined based on the interference signals corresponding to the positions in calibration pattern 806, for example, by surface height calculation unit 610 in FIG. 6. By setting region 802 as the baseline region with the surface baseline equal to 0, the surface height offset O of region 804 may be determined according to the equation: O=HA−HI. Accordingly, the surface height offset associated with category B is HA−HI, and the surface height offset associated with category A is 0 (i.e., the value of surface baseline). It is understood that if more than two categories are classified, the surface height offsets of each other category may be determined in the same manner.

Referring back to FIG. 6, characterization module 606 is configured to characterize the surface topography of the semiconductor chip based, at least in part, on the surface height offset and interference signals 612. In some embodiments, to characterize the surface topography of the semiconductor chip, characterization module 606 is further configured to calculate a calibrated surface height at one of the positions on the surface of the semiconductor chip based, at least in part, on the corresponding original surface height and the surface height offset. That is, for any specific position on the surface of the semiconductor chip, its original surface height can be derived from corresponding interference signal 612 by surface height calculation unit 610, and can be classified into one of the categories by interference signal classifier 602 as described above. The surface height offset of the category in which the specific position is classified can be determined by calibration module 604 as described above. Accordingly, the calibrated surface height of the specific position, which presumably has higher accuracy and precision, can be calculated by adding the surface height offset to its original surface height. The calibrated surface heights of any desired number of positions on the surface of the semiconductor chip can be calculated in the same manner to characterize the surface topography of the semiconductor chip in any suitable forms, such as a calibrated height map of the semiconductor chip surface described below in detail. As a result, by using interference signal classifier 602 based on interference signals 612 and model 608, the surface topography of the semiconductor chip can be characterized with high throughput. By using calibration module 604 based on calibration signals 614, the accuracy and precision of the surface topography of the semiconductor chip can be maintained at the desired level.

Figure 9:
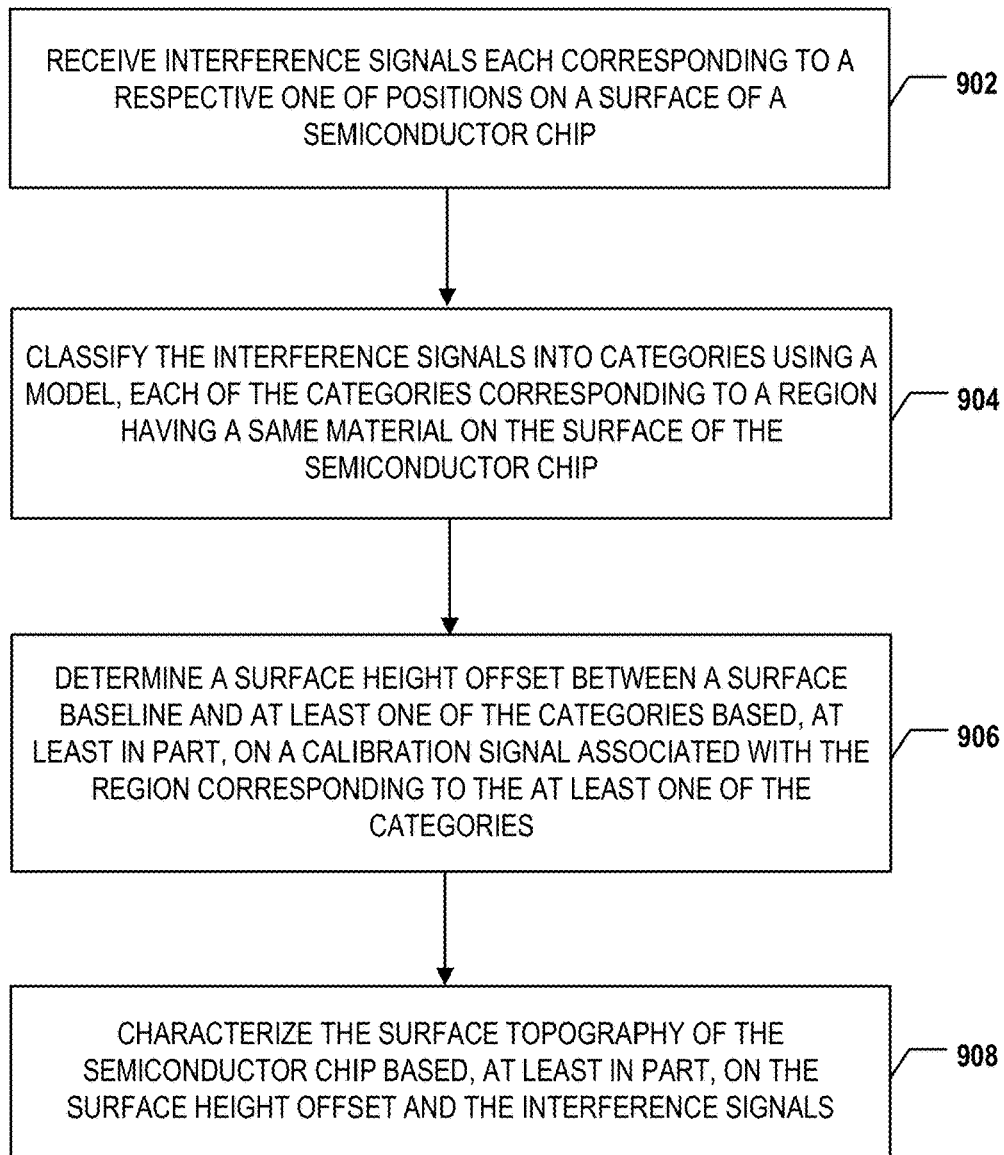
FIG. 9 is a flowchart of an exemplary method for measuring the surface topography of a semiconductor chip, according to some embodiments of the present disclosure.

FIG. 9 is a flowchart of an exemplary method 900 for measuring the surface topography of a semiconductor chip, according to some embodiments of the present disclosure. Examples of the device that can perform operations of method 900 include computing device 600 depicted in FIG. 6. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a plurality of interference signals each corresponding to a respective one of a plurality of positions on a surface of the semiconductor chip are received. For example, interference signals 612 may be received by interference signal classifier 602 of computing device 600. In some embodiments, each interference signal includes an interference fringe of low coherent interferometry and is associated with an original surface height at the respective position. In some embodiments, the semiconductor chip includes multiple layers, and at least part of the surface of the semiconductor chip includes a transparent layer, such as a silicon oxide layer or a silicon nitride layer.

Method 900 proceeds to operation 904, as illustrated in FIG. 9, in which the interference signals are classified into a plurality of categories using a model. Each of the categories can correspond to a region having the same material on the surface of the semiconductor chip. For example, interference signals 612 may be classified into multiple categories using model 608 by interference signal classifier 602 of computing device 600. In some embodiments, the model includes a classification model, and the categories are predetermined based on the design of the semiconductor chip, such that each category corresponds to the respective region having the same material. In some embodiments, the model further includes a clustering model, and the interference signals are first clustered into a plurality of clusters using the clustering model. The clusters are then adjusted to become the categories based, at least in part, on the design of the semiconductor chip, such that each category corresponds to the respective region having the same material, according to some embodiments.

Method 900 proceeds to operation 906, as illustrated in FIG. 9, in which a surface height offset between a surface baseline and at least one of the categories is determined based, at least in part, on a calibration signal associated with the region corresponding to the at least one of the categories. For example, surface height offsets of each category classified by interference signal classifier 602 may be determined based on calibration signals 614 by calibration module 604 of computing device 600. Method 900 proceeds to operation 908, as illustrated in FIG. 9, in which the surface topography of the semiconductor chip is characterized based, at least in part, on the surface height offset and the interference signals. For example, the surface topography of the semiconductor chip may be characterized by characterization module 606 of computing device 600 based on the surface height offsets determined by calibration module 604 and interference signals 612. In some embodiments, to characterize the surface topography of the semiconductor chip, a calibrated surface height is calculated at one of the positions on the surface of the semiconductor chip.

Figure 10:
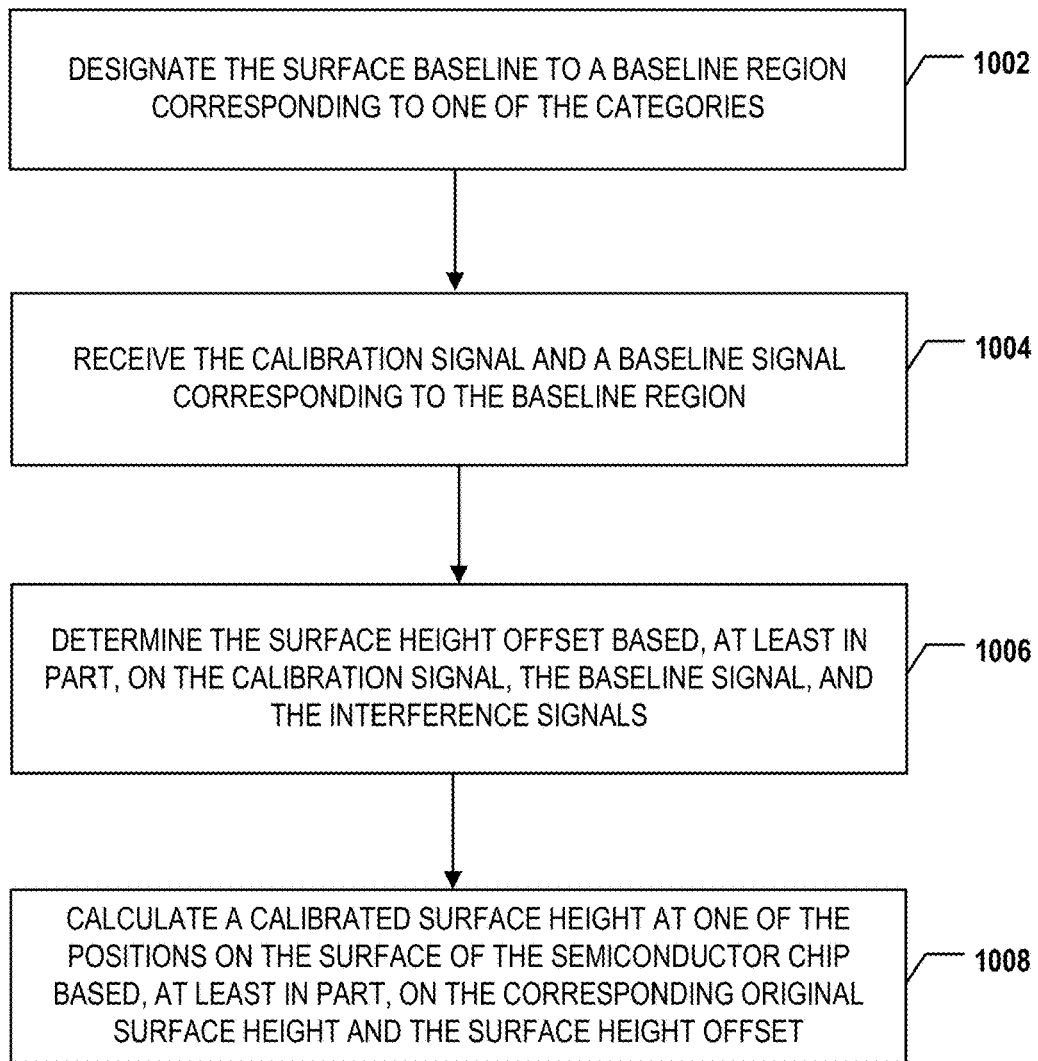
FIG. 10 is a flowchart of an exemplary method for calculating a calibrated surface height, according to some embodiments of the present disclosure.

FIG. 10 is a flowchart of an exemplary method 1000 for calculating a calibrated surface height, according to some embodiments of the present disclosure. Referring to FIG. 10, method 1000 starts at operation 1002, in which the surface baseline is designated to a baseline region corresponding to one of the categories. The baseline region is the largest region, according to some embodiments. Method 1000 proceeds to operation 1004, as illustrated in FIG. 10, in which the calibration signal and a baseline signal corresponding to the baseline region are received. Each of the calibration and baseline signals is associated with a topographic height determined by an SPM or an electron microscopy in a calibration pattern across the regions, according to some embodiments. Method 1000 proceeds to operation 1006, as illustrated in FIG. 10, in which the surface height offset is determined based, at least in part, on the calibration signal, the baseline signal, and the interference signals corresponding to the positions in the calibration pattern. Method 1000 proceeds to operation 1008, as illustrated in FIG. 10, in which the calibrated surface height at one of the positions on the surface of the semiconductor chip is calculated based, at least in part, on the corresponding original surface height derived from the corresponding interference signal and the surface height offset of the category in which the corresponding interference signal is classified.

Figure 11:
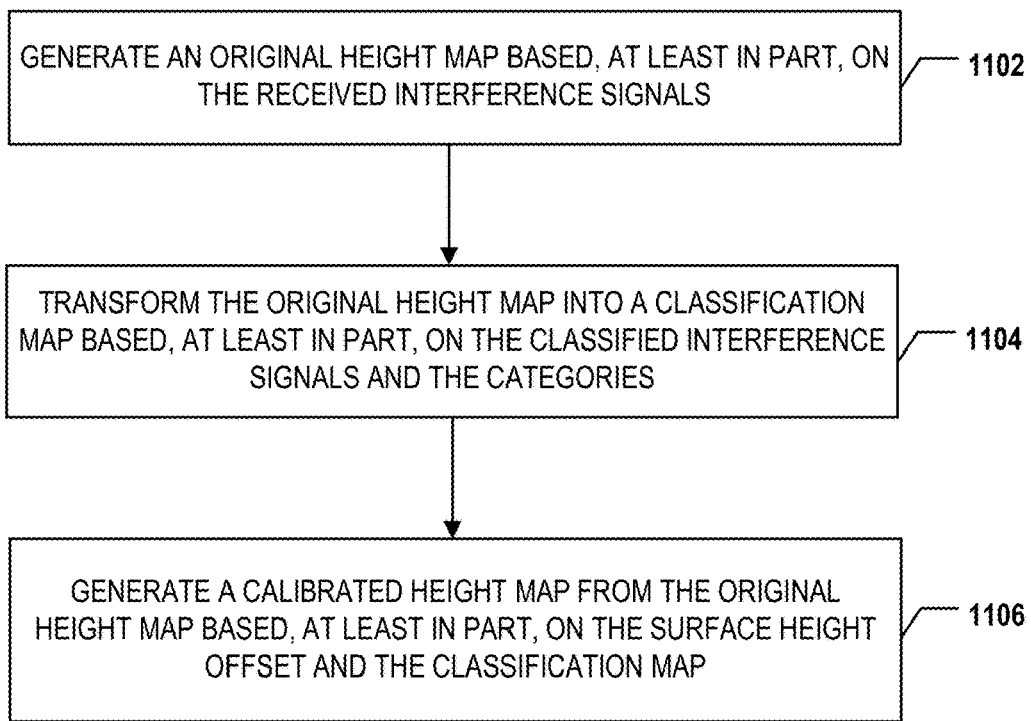
FIG. 11 is a flowchart of an exemplary method for generating a calibrated height map, according to some embodiments of the present disclosure.
Figure 12:
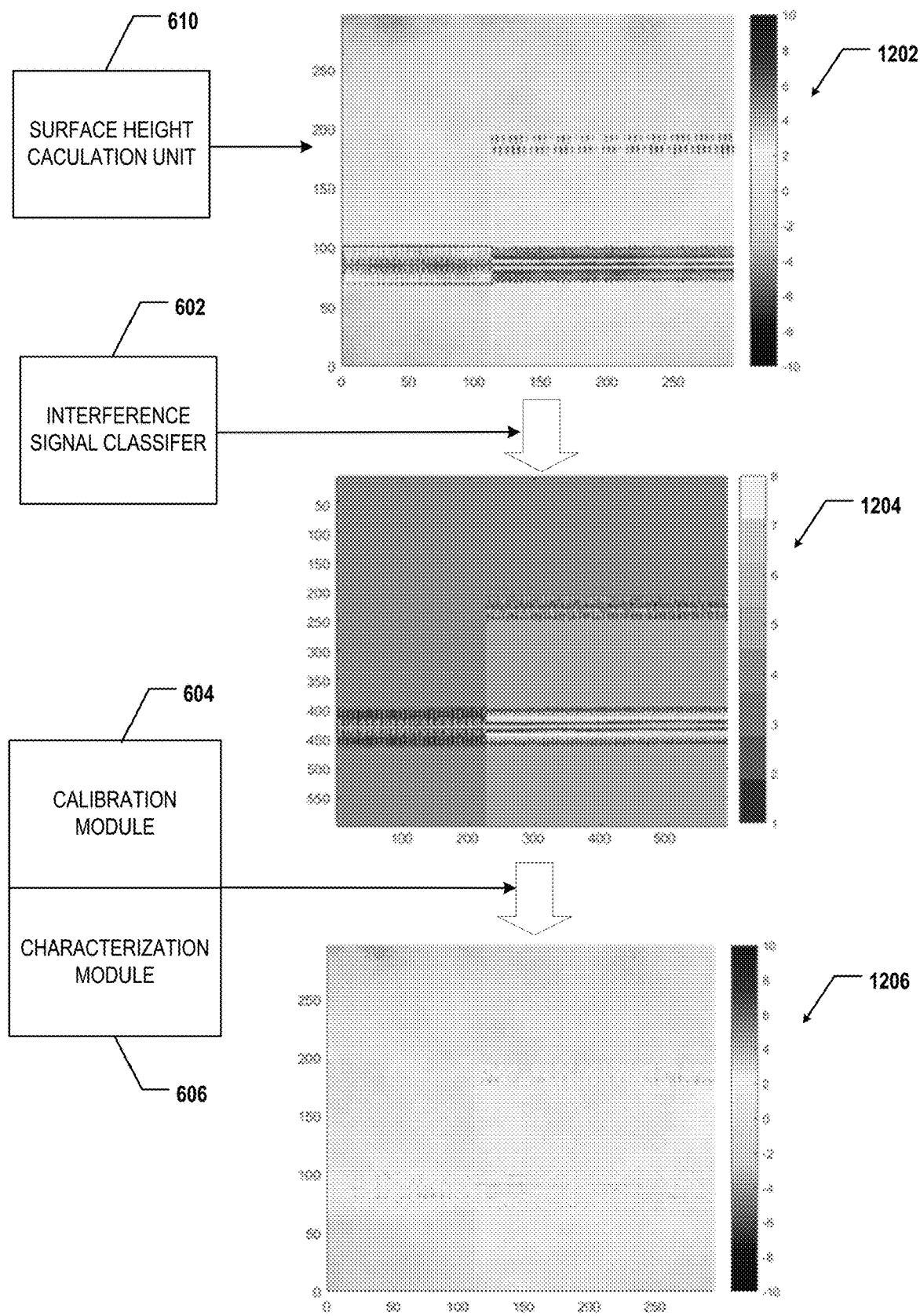
FIG. 12 illustrates exemplary original height map, classification map, and calibrated height map, according to some embodiments of the present disclosure.

As described above, the characterization of the surface topography of a semiconductor chip may be presented in any suitable forms, such as a calibrated height map. FIG. 11 is a flowchart of an exemplary method 1100 for generating a calibrated height map, according to some embodiments of the present disclosure. Referring to FIG. 11, method 1100 starts at operation 1102, in which an original height map is generated based, at least in part, on the received interference signals. For example, as shown in FIG. 12, an original height map 1202 may be generated based on interference signals 612. Original height map 1202 represents the original surface heights (e.g., between −10 nm and 10 nm) in a sampling field (in an area of 300 μm by 300 μm) on the surface of a semiconductor chip. The original surface height at each position in the sampling field may be resolved and derived from respective interference signal 612 by surface height calculation unit 610. Original height map 1202 may be generated with high throughput but low accuracy and precision.

Referring to FIG. 11, method 1100 proceeds to operation 1104, in which the original height map is transformed into a classification map based, at least in part, on the classified interference signals and the categories. For example, as shown in FIG. 12, original height map 1202 may be transformed into a classification map 1204 by interference signal classifier 602 based on classified interference signals 612 and the categories. Classification map 1204 represents 8 categories (e.g., 1 to 8) in the sampling field on the surface of a semiconductor chip. The category of each position in the sampling field may be the category in which interference signal 612 corresponding to the respective position is classified. A category may correspond to a region having the same material on the surface of the semiconductor chip. For example, category 4 may be the silicon substrate, which is also the largest region in the sampling field. Some categories may be merged as they correspond to regions having the same material. For example, categories 5-8 may be consolidated into one category.

Referring to FIG. 11, method 1100 proceeds to operation 1106, in which a calibrated height map is generated from the original height map based, at least in part, on the surface height offset and the classification map. For example, as shown in FIG. 12, a calibrated height map 1206 may be generated from original height map 1202 by calibration module 604 and characterization module 606 based on the surface height offsets and classification map 1204. Calibrated height map 1206 represents the calibrated surface heights (e.g., between −10 nm and 10 nm) in the sampling field on the surface of a semiconductor chip. One of the regions may be selected as the baseline region, and the surface baseline (e.g., 0) may be designated to the corresponding category. For example, surface baseline 0 may be designated to category 4. The surface height offsets of each category in classification map 1204 may be determined with respect to the surface baseline and used for generating calibrated height map 1206 by adding the corresponding surface height offset to the respective original surface height at each position in original height map 1202. Compared with original height map 1202, calibrated height map 1206 have higher accuracy and precision.

Figure 13:
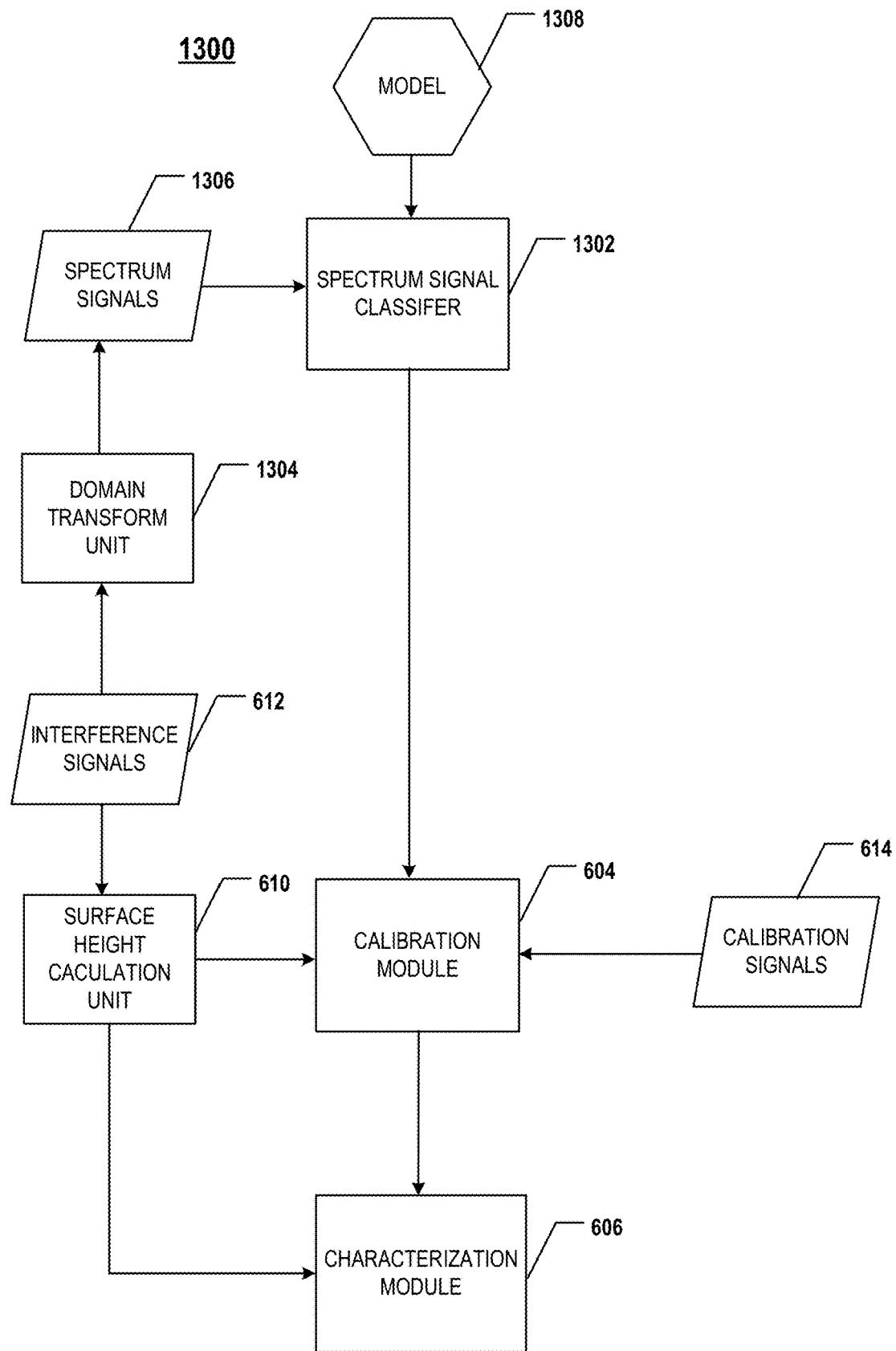
FIG. 13 illustrates a schematic diagram of another exemplary computing device of the system in FIG. 1 for measuring the surface topography of a semiconductor chip, according to some embodiments of the present disclosure.

FIG. 13 illustrates a schematic diagram of another exemplary computing device 1300 of system 100 in FIG. 1 for measuring the surface topography of a semiconductor chip, according to some embodiments of the present disclosure. Computing device 1300 may be another example of computing device 102 in FIG. 1. Computing device 1300 can include a plurality of functional modules and units implemented by at least one processor. Different from computing device 600 in FIG. 6 including interference signal classifier 602 configured to classify interference signals 612, computing device 1300 includes a domain transform unit 1304 configured to transform interference signals 612 into spectrum signals 1306 and also includes a spectrum signal classifier 1302 configured to classify spectrum signals 1306 using a model 1308 for classifying spectrum signals 1306, according to some embodiments. Similar to computing device 600 in FIG. 6, computing device 1300 further includes calibration module 604, characterization module 606, and surface height calculation unit 610, according to some embodiments. It is understood that the details of the similar modules or units (e.g., the inputs, outputs, functions, etc.) in both computing devices 600 and 1300 may not be repeated below.

In some embodiments, spectrum signal classifier 1302 is configured to receive a plurality of spectrum signals 1306 each corresponding to a respective one of a plurality of positions on a surface of the semiconductor chip. As described above, spectrum signals 1306 are another type of signals that can be classified using a machine learning process with high throughput for surface topography characterization, according to some embodiments. Spectrum signals 1306 can be transformed from interference signals 612 by domain transform unit 1304 as shown in FIG. 13. Domain transform unit 1304 can transform signals between two domains, such as the temporal domain, time domain, spatial domain, frequency domain, etc. In some embodiments, domain transform unit 1304 is configured to transform interference signals 612 (in the spatial domain) into spectrum signals 1306 (in the frequency domain) each corresponding to the respective one of the positions on the surface of the semiconductor. In one example, interference signals 612 may be transformed into spectrum signals 1306 using Fourier transform by domain transform unit 1304. Fourier transform can decompose a function of time (a signal) into its constituent frequencies. Consequently, each position in the sampling field can be associated with respective interference signal 612 as well as respective spectrum signal 1306. Spectrum signals 1306 can contain the sample's material and structure information. Each spectrum signal 1306 includes a reflectance spectrum, according to some embodiments.

Figure 14A:
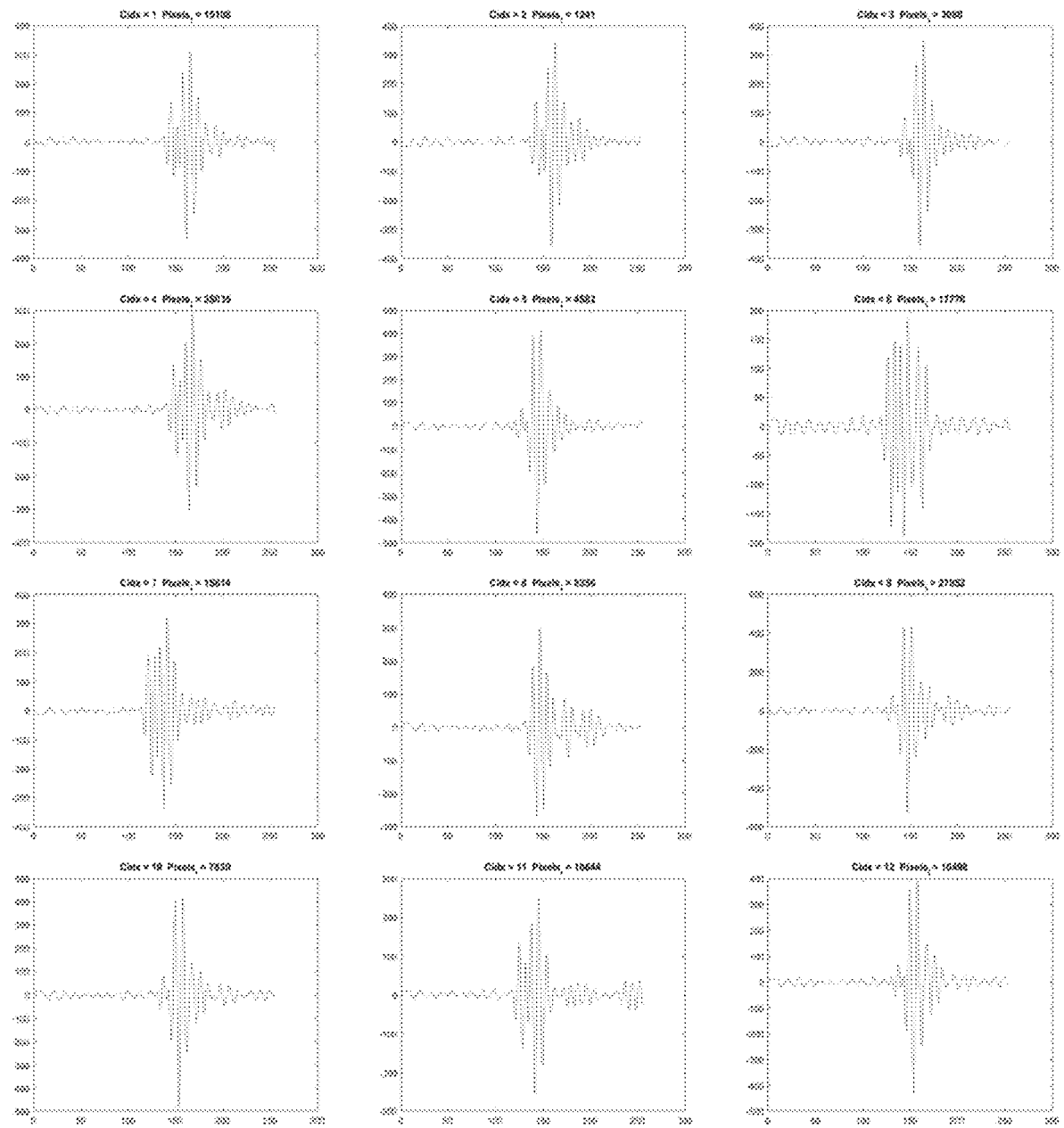
FIG. 14A illustrates exemplary 12 interference signals, according to some embodiments of the present disclosure.
Figure 14B:
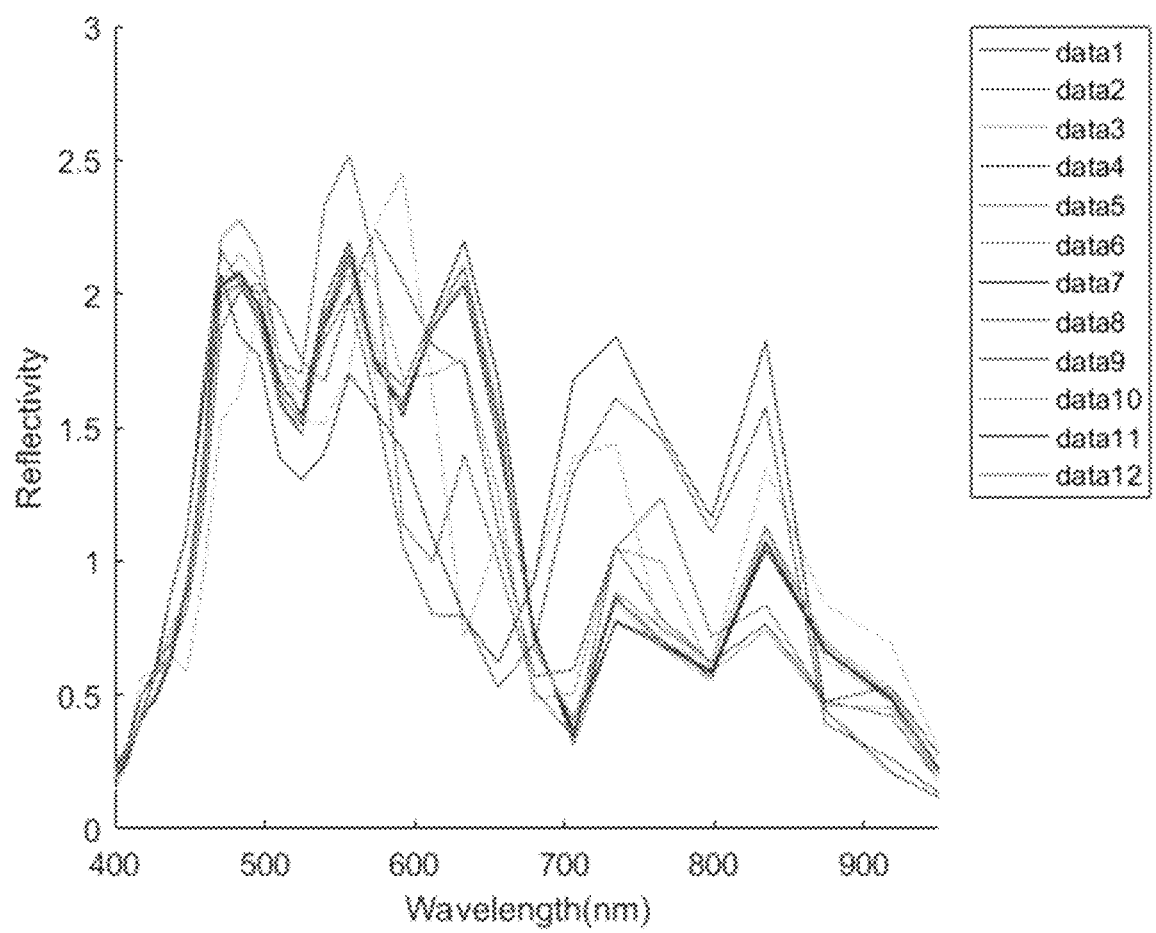
FIG. 14B illustrates 12 spectrum signals transformed from the exemplary 12 interference signals in FIG. 14A, according to some embodiments of the present disclosure.

FIG. 14A illustrates exemplary 12 interference signals, according to some embodiments of the present disclosure. Each of the 12 interference signals may include an interference fringe of low coherent interferometry. At least some of the interference fringes may be multi-components interference fringes corresponding to one or more transparent layers in the sampling field on the sample surface. FIG. 14B illustrates 12 spectrum signals transformed from the exemplary 12 interference signals in FIG. 14A, according to some embodiments of the present disclosure. Each of the 12 spectrum signals may include a reflectance spectrum, which represents the reflectivity change in the wavelength range of the light source spectrum of the interferometer providing the 12 interference signals. As described above, the wavelength range of the light source spectrum of the interferometer may be suitable for any low coherent interferometry, such as in the white light range or extended beyond the white light range, which may affect the transformed reflectance spectrums as well.

Referring back to FIG. 13, model 1308 for classifying spectrum signals, run by computing device 1300, is used by spectrum signal classifier 1302, according to some embodiments. As described below in detail, model 1308 can be a machine learning model trained for classifying spectrum signals. It is understood that model 1308 for classifying spectrum signals and model 608 in FIG. 6 for classifying interference signals may be the same type of machine learning models including a classification model (e.g., a KNN), but trained with different types of training samples, i.e., spectrum signals as the training samples for model 1308 and interference signals as the training samples for model 608.

In some embodiments, spectrum signal classifier 1302 is further configured to classify spectrum signals 1306 into a plurality of categories using model 1308. Each of the categories corresponds to a region having the same material on the surface of the semiconductor chip, according to some embodiments. Model 1308 can include a classification model, such as KNN, case-based reasoning, decision tree, naive Bayes, ANN, logistic regression, Fisher's linear discriminant, SVM, or perceptron. In some embodiments in which model 1308 includes a classification model, as part of the supervised learning, the categories are known and predetermined. For example, each category may correspond to a region having the same material on the surface of the semiconductor chip. That is, based on the design of the semiconductor chip, e.g., the structures and materials in the sampling field, a plurality of categories can be identified as the labels for the training as well as the output variables for classification. In one example, a first category may correspond to a first region of silicon oxide (a transparent layer), a second category may correspond to a second region of tungsten (an opaque layer), and a third category may correspond to a third region of silicon substrate (an opaque layer) in the sampling field on the surface of the semiconductor chip.

In some embodiments, model 1308 includes a clustering model, such as linkage clustering, k-means clustering, Gaussian mixture model clustering, or density-based clustering. In some embodiments in which model 1308 includes a clustering model, as part of the unsupervised learning, the categories used by spectrum signal classifier 1302 are not predetermined. In some embodiments, spectrum signal classifier 1302 is configured to cluster spectrum signals 1306 into a plurality of clusters using model 1308 (e.g., a clustering model) and adjust the clusters to become the categories used by spectrum signal classifier 1302 based, at least in part, on the design of the semiconductor chip, such that each category corresponds to the respective region having the same material. In other words, clusters can be learned first in an unsupervised manner, and the categories can be determined from the clusters in a supervised manner based on, for example, the structures and materials in the sampling field. In one example, a cluster that does not correspond to a region having the same material in the sampling field may be disregarded. In another example, multiple clusters that correspond to the same region having the same material or correspond to different regions have the same material may be merged.

In some embodiments, any suitable feature selection and feature extraction approaches can be applied to spectrum signals 1306 by spectrum signal classifier 1302 to select and/or extract features (e.g., feature vectors), either latent features or patent features, from each spectrum signal 1306 to reduce the complexity and improve the efficiency of the classification process. In one example, model 1308 may include KNN, and 10-dimensional feature vectors may be extracted from each spectrum signal 1306 for classification using the KNN model by spectrum signal classifier 1302.

In some embodiments, calibration module 604 is configured to determine a surface height offset between a surface baseline and at least one of the categories from spectrum signal classifier 1302 based, at least in part, on calibration signal 614 associated with the region corresponding to the at least one of the categories, as described above in detail with respect to FIG. 6. That is, a respective surface height offset can be added to each category based on the same surface baseline for calibration to increase the accuracy and precision of the surface topography.

In some embodiments, characterization module 606 is configured to characterize the surface topography of the semiconductor chip based, at least in part, on the surface height offset and interference signals 612, as described above in detail with respect to FIG. 6. In some embodiments, to characterize the surface topography of the semiconductor chip, characterization module 606 is further configured to calculate a calibrated surface height at one of the positions on the surface of the semiconductor chip based, at least in part, on the corresponding original surface height and the surface height offset. That is, for any specific position on the surface of the semiconductor chip, its original surface height can be derived from corresponding interference signal 612 by surface height calculation unit 610, and can be classified into one of the categories by spectrum signal classifier 1302 as described above in detail. As a result, by using spectrum signal classifier 1302 based on transformed spectrum signals 1306 and model 1308, the surface topography of the semiconductor chip can be characterized with high throughput. By using calibration module 604 based on calibration signals 614, the accuracy and precision of the surface topography of the semiconductor chip can be maintained at the desired level.

Figure 15:
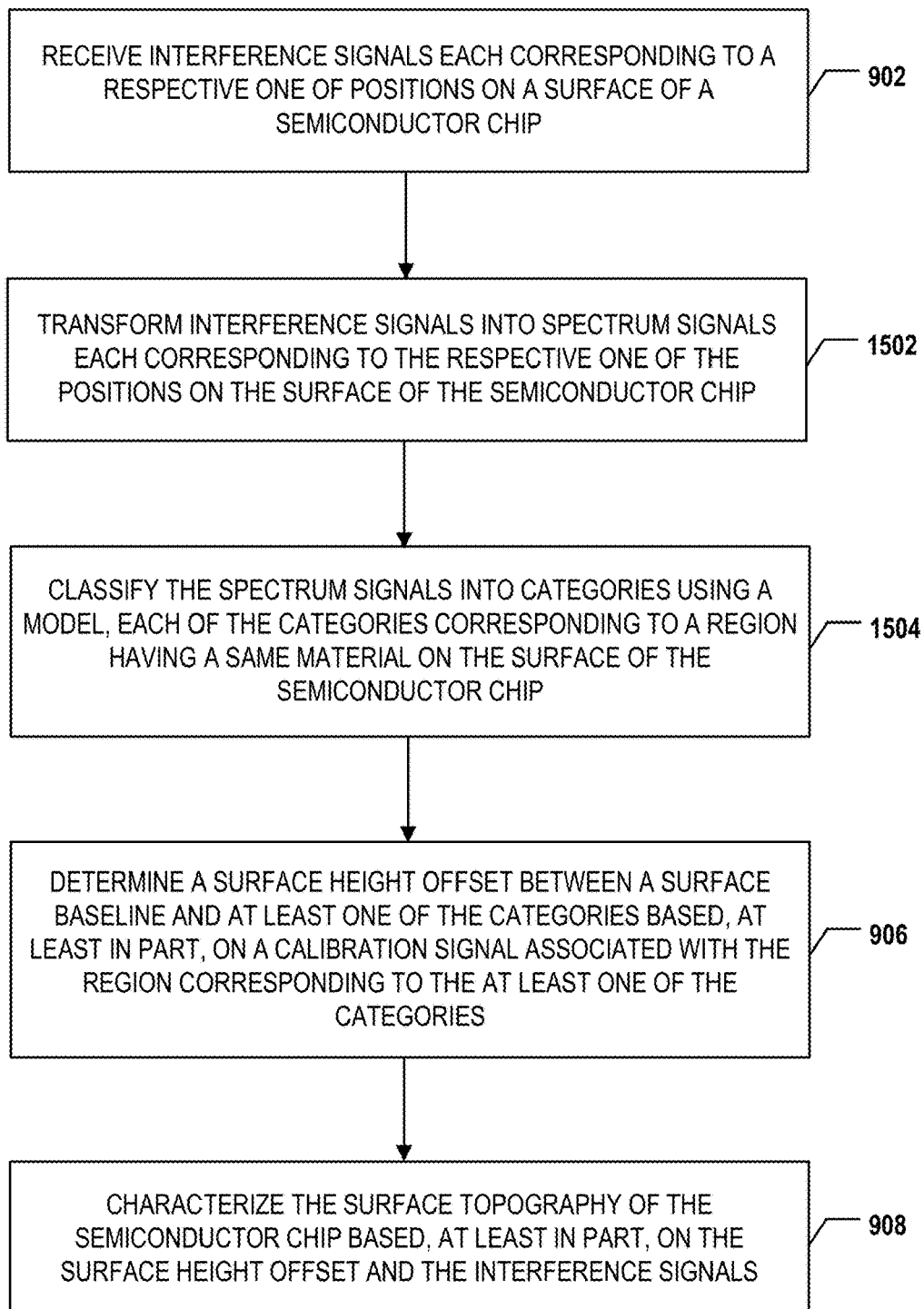
FIG. 15 is a flowchart of another exemplary method for measuring the surface topography of a semiconductor chip, according to some embodiments of the present disclosure.

FIG. 15 is a flowchart of another exemplary method 1500 for measuring the surface topography of a semiconductor chip, according to some embodiments of the present disclosure. Examples of the device that can perform operations of method 1500 include computing device 1300 depicted in FIG. 13. It is understood that the operations shown in method 1500 are not exhaustive and that other operations can be performed as well before, after, or between any of the illustrated operations. Further, some of the operations may be performed simultaneously, or in a different order than shown in FIG. 15. It is understood that some operations in method 1500 are substantially the same as their counterparts in method 900 in FIG. 9 and thus, the details of the substantially same operations in both methods 900 and 1500 may not be repeated below.

Referring to FIG. 15, method 1500 starts at operation 902, in which a plurality of interference signals each corresponding to a respective one of a plurality of positions on a surface of the semiconductor chip are received. For example, interference signals 612 may be received by domain transform unit 1304 of computing device 1300. In some embodiments, each interference signal includes an interference fringe of low coherent interferometry and is associated with an original surface height at the respective position. In some embodiments, the semiconductor chip includes multiple layers, and at least part of the surface of the semiconductor chip includes a transparent layer, such as a silicon oxide layer or a silicon nitride layer.

Method 1500 proceeds to operation 1502, as illustrated in FIG. 15, in which the interference signals are transformed into a plurality of spectrum signals each corresponding to the respective one of the positions on the surface of the semiconductor chip. For example, interference signals 612 may be transformed into spectrum signals 1306 by domain transform unit 1304 of computing device 1300. In some embodiments, each of the spectrum signals includes a reflectance spectrum. In some embodiments, the interference signals are transformed into the spectrum signals using Fourier transform.

Method 1500 proceeds to operation 1504, as illustrated in FIG. 15, in which the spectrum signals are classified into a plurality of categories using a model. Each of the categories can correspond to a region having the same material on the surface of the semiconductor chip. For example, spectrum signals 1306 may be classified into multiple categories using model 1308 by spectrum signal classifier 1302 of computing device 1300. In some embodiments, the model includes a classification model, and the categories are predetermined based on the design of the semiconductor chip, such that each category corresponds to the respective region having the same material. In some embodiments, the model further includes a clustering model, and the interference signals are first clustered into a plurality of clusters using the clustering model. The clusters are then adjusted to become the categories based, at least in part, on the design of the semiconductor chip, such that each category corresponds to the respective region having the same material, according to some embodiments.

Method 1500 proceeds to operation 906, as illustrated in FIG. 15, in which a surface height offset between a surface baseline and at least one of the categories is determined based, at least in part, on a calibration signal associated with the region corresponding to the at least one of the categories. For example, surface height offsets of each category classified by spectrum signal classifier 1302 may be determined based on calibration signals 614 by calibration module 604 of computing device 1300. Method 1500 proceeds to operation 908, as illustrated in FIG. 15, in which the surface topography of the semiconductor chip is characterized based, at least in part, on the surface height offset and the interference signals. For example, the surface topography of the semiconductor chip may be characterized by characterization module 606 of computing device 1300 based on the surface height offsets determined by calibration module 604 and interference signals 612. In some embodiments, to characterize the surface topography of the semiconductor chip, a calibrated surface height is calculated at one of the positions on the surface of the semiconductor chip. One example of calculating a calibrated surface height is described above with respect to FIG. 10 and thus, is not repeated here for ease of description.

Figure 16:
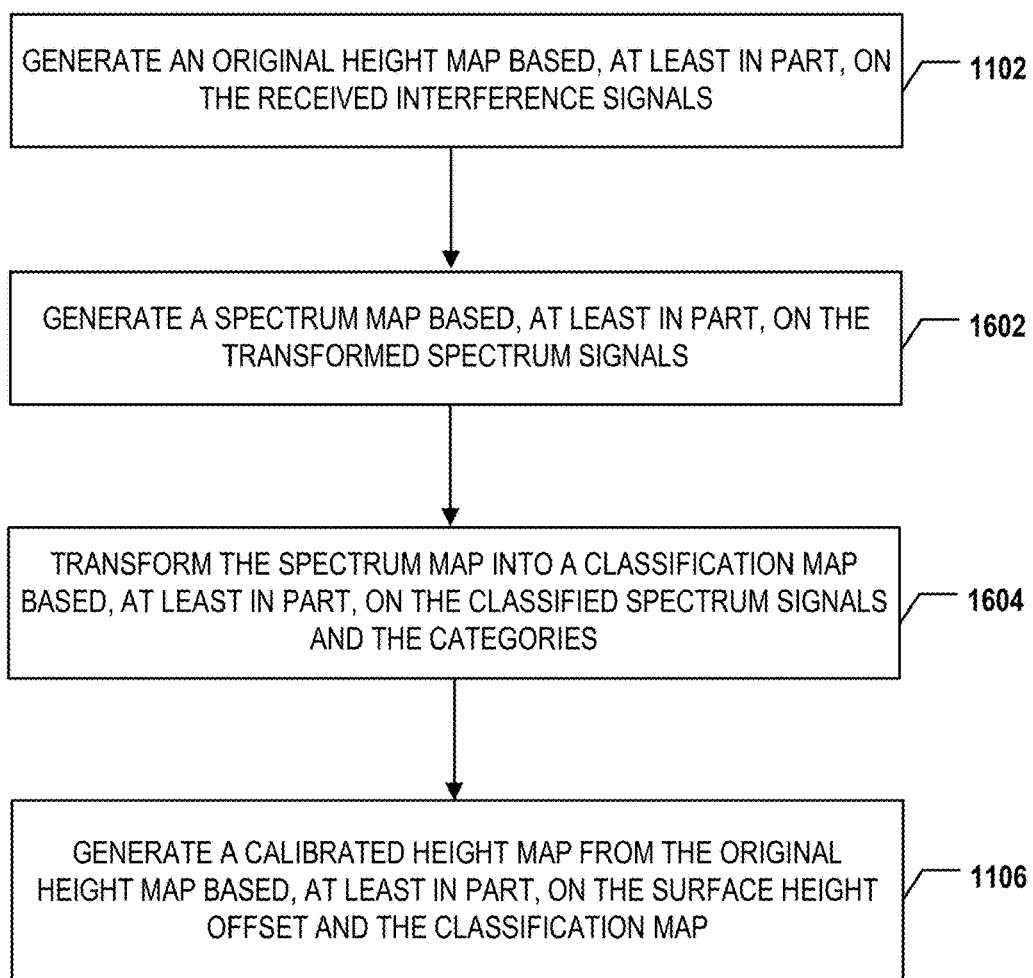
FIG. 16 is a flowchart of another exemplary method for generating a calibrated height map, according to some embodiments of the present disclosure.

As described above, the characterization of the surface topography of a semiconductor chip may be presented in any suitable forms, such as a calibrated height map. FIG. 16 is a flowchart of another exemplary method 1600 for generating a calibrated height map, according to some embodiments of the present disclosure. It is understood that some operations in method 1600 are substantially the same as their counterparts in method 1100 in FIG. 11 and thus, the details of the substantially same operations in both methods 1100 and 1600 may not be repeated below.

Referring to FIG. 16, method 1600 starts at operation 1102, in which an original height map is generated based, at least in part, on the received interference signals. Method 1600 proceeds to operation 1602, as illustrated in FIG. 16, in which a spectrum map is generated based, at least in part, on the transformed spectrum signals. Method 1600 proceeds to operation 1604, as illustrated in FIG. 16, in which the spectrum map is transformed into a classification map based, at least in part, on the classified spectrum signals and the categories. Method 1600 proceeds to operation 1106, as illustrated in FIG. 16, in which a calibrated height map is generated from the original height map based, at least in part, on the surface height offset and the classification map.

Figure 17:
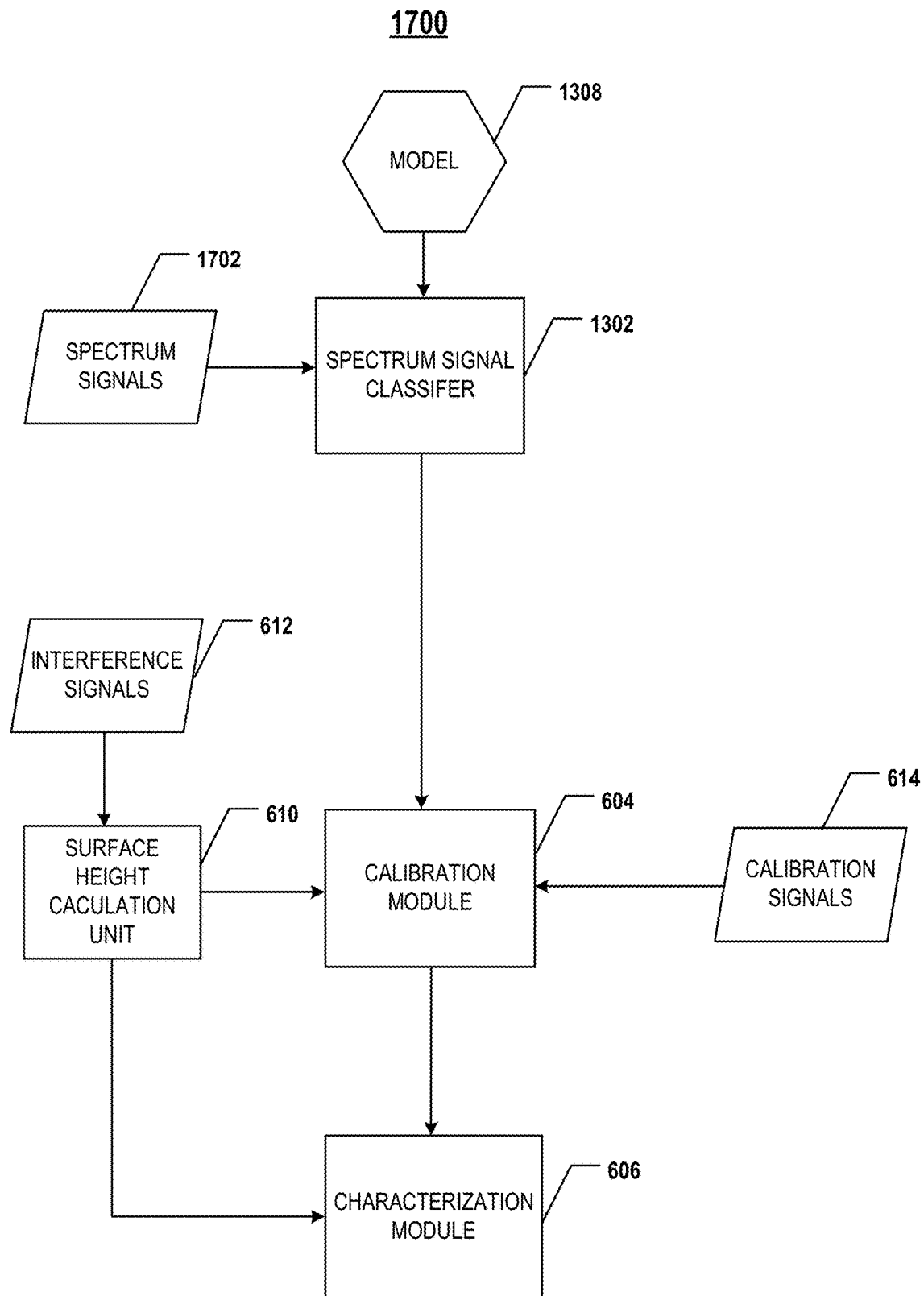
FIG. 17 illustrates a schematic diagram of still another exemplary computing device of the system in FIG. 1 for measuring the surface topography of a semiconductor chip, according to some embodiments of the present disclosure.

FIG. 17 illustrates a schematic diagram of still another exemplary computing device 1700 of system 100 in FIG. 1 for measuring the surface topography of a semiconductor chip, according to some embodiments of the present disclosure. Computing device 1700 may be still another example of computing device 102 in FIG. 1. Computing device 1700 can include a plurality of functional modules and units implemented by at least one processor. Different from computing device 1300 in FIG. 13 in which spectrum signals 1306 are transformed from interference signal 612 by domain transform unit 1304, spectrum signals 1702 in FIG. 17 are received from a spectrometer (e.g., 106 in FIGS. 1 and 316 in FIG. 3B) by spectrum signal classifier 1302, according to some embodiments. That is, computing device 1700 may not include domain transform unit 1304. Similar to computing device 1300 in FIG. 13, computing device 1700 further includes spectrum signal classifier 1302, model 1308 for classifying spectrum signals, calibration module 604, characterization module 606, and surface height calculation unit 610, according to some embodiments. It is understood that the details of the similar modules or units (e.g., the inputs, outputs, functions, etc.) in both computing devices 1300 and 1700 may not be repeated below.

In some embodiments, spectrum signal classifier 1302 is configured to receive a plurality of spectrum signals 1702 each corresponding to a respective one of a plurality of positions on a surface of the semiconductor chip. As described above, spectrum signals 1702 are another type of signals that can be classified using a machine learning process with high throughput for surface topography characterization, according to some embodiments. Spectrum signals 1702 can be obtained directly from a spectrometer, such as an optical spectrometer. Spectrum signals 1702 can contain the sample's material and structure information. Each spectrum signal 1702 includes a reflectance spectrum, according to some embodiments.

In some embodiments, spectrum signal classifier 1302 is further configured to classify spectrum signals 1702 into a plurality of categories using model 1308. Each of the categories corresponds to a region having the same material on the surface of the semiconductor chip, according to some embodiments. Model 1308 can include a classification model, such as KNN, case-based reasoning, decision tree, naive Bayes, ANN, logistic regression, Fisher's linear discriminant, SVM, or perceptron. In some embodiments, model 1308 includes a clustering model, such as linkage clustering, k-means clustering, Gaussian mixture model clustering, or density-based clustering. Any suitable feature selection and feature extraction approaches can be applied to spectrum signals 1702 by spectrum signal classifier 1302 to select and/or extract features (e.g., feature vectors), either latent features or patent features, from each spectrum signal 1702 to reduce the complexity and improve the efficiency of the classification process. In one example, model 1308 may include KNN, and 10-dimensional feature vectors may be extracted from each spectrum signal 1702 for classification using the KNN model by spectrum signal classifier 1302.

In some embodiments, calibration module 604 is configured to determine a surface height offset between a surface baseline and at least one of the categories from spectrum signal classifier 1302 based, at least in part, on calibration signal 614 associated with the region corresponding to the at least one of the categories, as described above in detail with respect to FIG. 6. That is, a respective surface height offset can be added to each category based on the same surface baseline for calibration to increase the accuracy and precision of the surface topography.

In some embodiments, characterization module 606 is configured to characterize the surface topography of the semiconductor chip based, at least in part, on the surface height offset and interference signals 612, as described above in detail with respect to FIG. 6. For any specific position on the surface of the semiconductor chip, its original surface height can be resolved and derived from corresponding interference signal 612 by surface height calculation unit 610, and can be classified into one of the categories by spectrum signal classifier 1302 as described above in detail. As a result, by using spectrum signal classifier 1302 based on received spectrum signals 1702 and model 1308, the surface topography of the semiconductor chip can be characterized with high throughput. By using calibration module 604 based on calibration signals 614, the accuracy and precision of the surface topography of the semiconductor chip can be maintained at the desired level.

Figure 18:
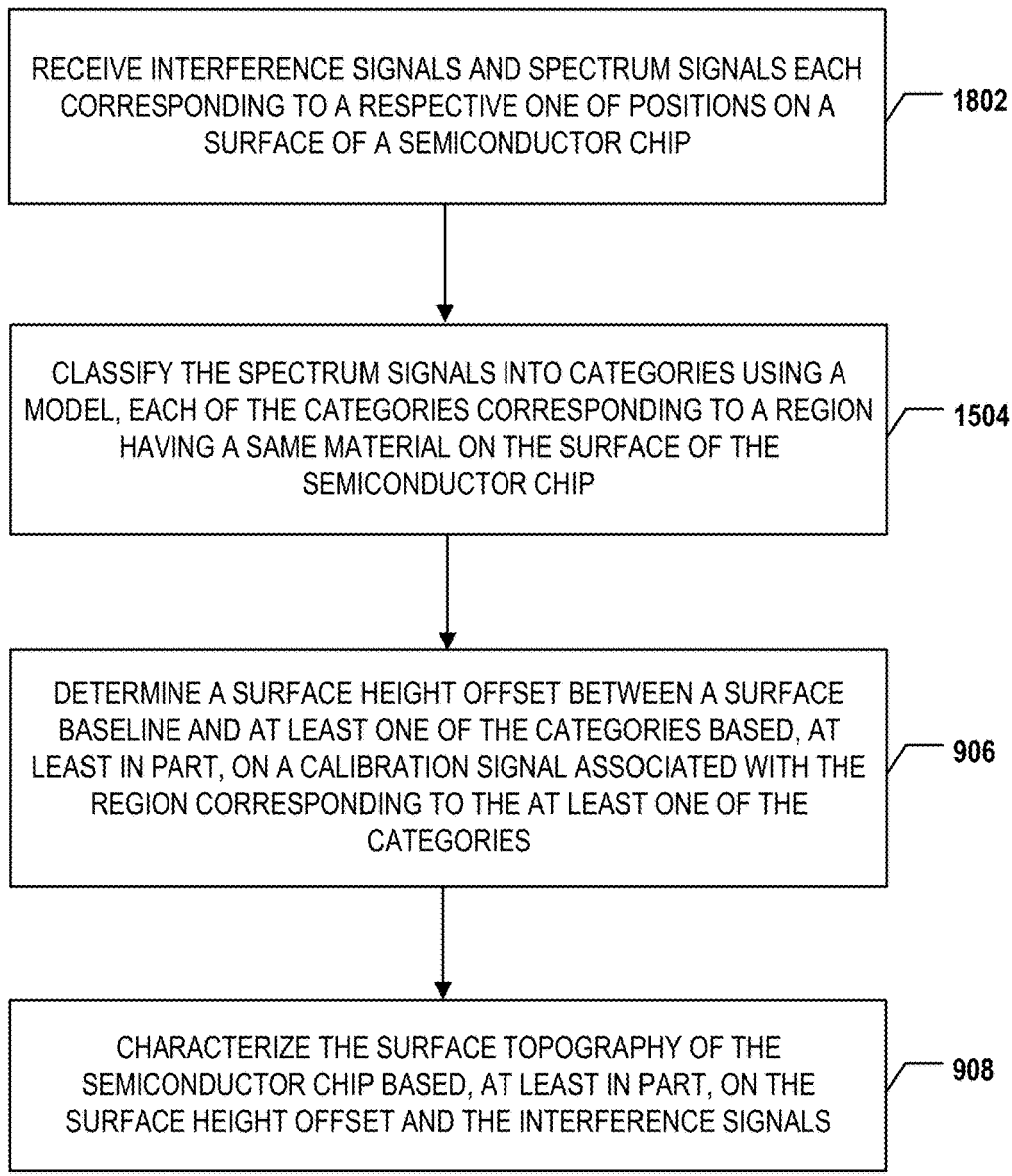
FIG. 18 is a flowchart of still another exemplary method for measuring the surface topography of a semiconductor chip, according to some embodiments of the present disclosure.

FIG. 18 is a flowchart of still another exemplary method 1800 for measuring the surface topography of a semiconductor chip, according to some embodiments of the present disclosure. Examples of the device that can perform operations of method 1800 include computing device 1700 depicted in FIG. 17. It is understood that the operations shown in method 1800 are not exhaustive and that other operations can be performed as well before, after, or between any of the illustrated operations. Further, some of the operations may be performed simultaneously, or in a different order than shown in FIG. 18. It is understood that some operations in method 1800 are substantially the same as their counterparts in method 1500 in FIG. 15 and thus, the details of the substantially same operations in both methods 1800 and 1500 may not be repeated below.

Referring to FIG. 18, method 1800 starts at operation 1802, in which a plurality of interference signals and a plurality of spectrum signals are received. Each of the interference signals and spectrum signals can correspond to a respective one of a plurality of positions on a surface of the semiconductor chip. That is, a pair of an interference signal and a spectrum signal can be sampled from the same position in the sampling field. For example, spectrum signals 1702 may be received by spectrum signal classifier 1302, and interference signals 612 may be received by surface height calculation unit 610 of computing device 1700. In some embodiments, each interference signal includes an interference fringe of low coherent interferometry and is associated with an original surface height at the respective position, and each spectrum signal includes a reflectance spectrum. In some embodiments, the semiconductor chip includes multiple layers, and at least part of the surface of the semiconductor chip includes a transparent layer, such as a silicon oxide layer or a silicon nitride layer.

Method 1800 proceeds to operation 1504, as illustrated in FIG. 18, in which the spectrum signals are classified into a plurality of categories using a model. Each of the categories can correspond to a region having the same material on the surface of the semiconductor chip. For example, spectrum signals 1702 may be classified into multiple categories using model 1308 by spectrum signal classifier 1302 of computing device 1700. In some embodiments, the model includes a classification model, and the categories are predetermined based on the design of the semiconductor chip, such that each category corresponds to the respective region having the same material. In some embodiments, the model further includes a clustering model, and the interference signals are first clustered into a plurality of clusters using the clustering model. The clusters are then adjusted to become the categories based, at least in part, on the design of the semiconductor chip, such that each category corresponds to the respective region having the same material, according to some embodiments.

Method 1800 proceeds to operation 906, as illustrated in FIG. 18, in which a surface height offset between a surface baseline and at least one of the categories is determined based, at least in part, on a calibration signal associated with the region corresponding to the at least one of the categories. For example, surface height offsets of each category classified by spectrum signal classifier 1302 may be determined based on calibration signals 614 by calibration module 604 of computing device 1700. Method 1800 proceeds to operation 908, as illustrated in FIG. 18, in which the surface topography of the semiconductor chip is characterized based, at least in part, on the surface height offset and the interference signals. For example, the surface topography of the semiconductor chip may be characterized by characterization module 606 of computing device 1700 based on the surface height offsets determined by calibration module 604 and interference signals 612. In some embodiments, to characterize the surface topography of the semiconductor chip, a calibrated surface height is calculated at one of the positions on the surface of the semiconductor chip. One example of calculating a calibrated surface height is described above with respect to FIG. 10 and thus, is not repeated for ease of description.

Figure 19:
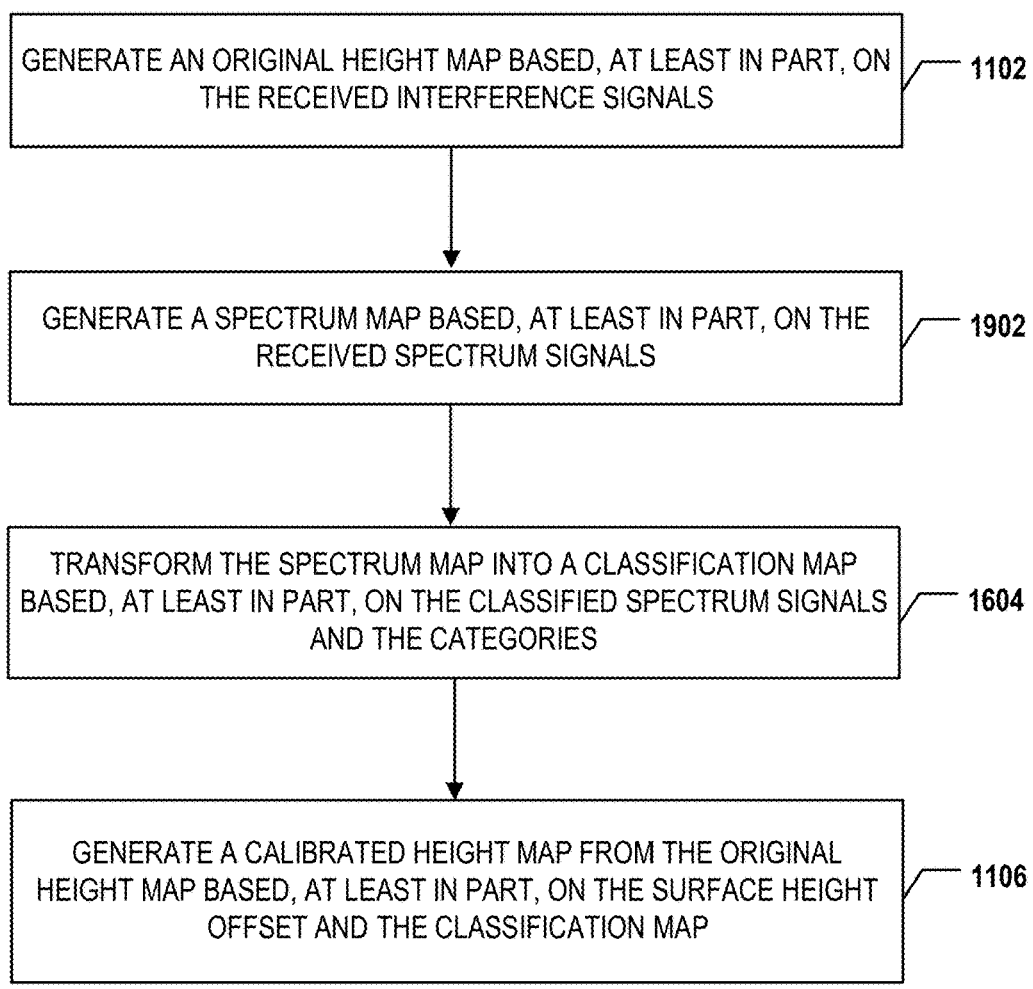
FIG. 19 is a flowchart of still another exemplary method for generating a calibrated height map, according to some embodiments of the present disclosure.

As described above, the characterization of the surface topography of a semiconductor chip may be presented in any suitable forms, such as a calibrated height map. FIG. 19 is a flowchart of still another exemplary method 1900 for generating a calibrated height map, according to some embodiments of the present disclosure. It is understood that some operations in method 1900 are substantially the same as their counterparts in method 1600 in FIG. 16 and thus, the details of the substantially same operations in both methods 1900 and 1600 may not be repeated below.

Figure 20:
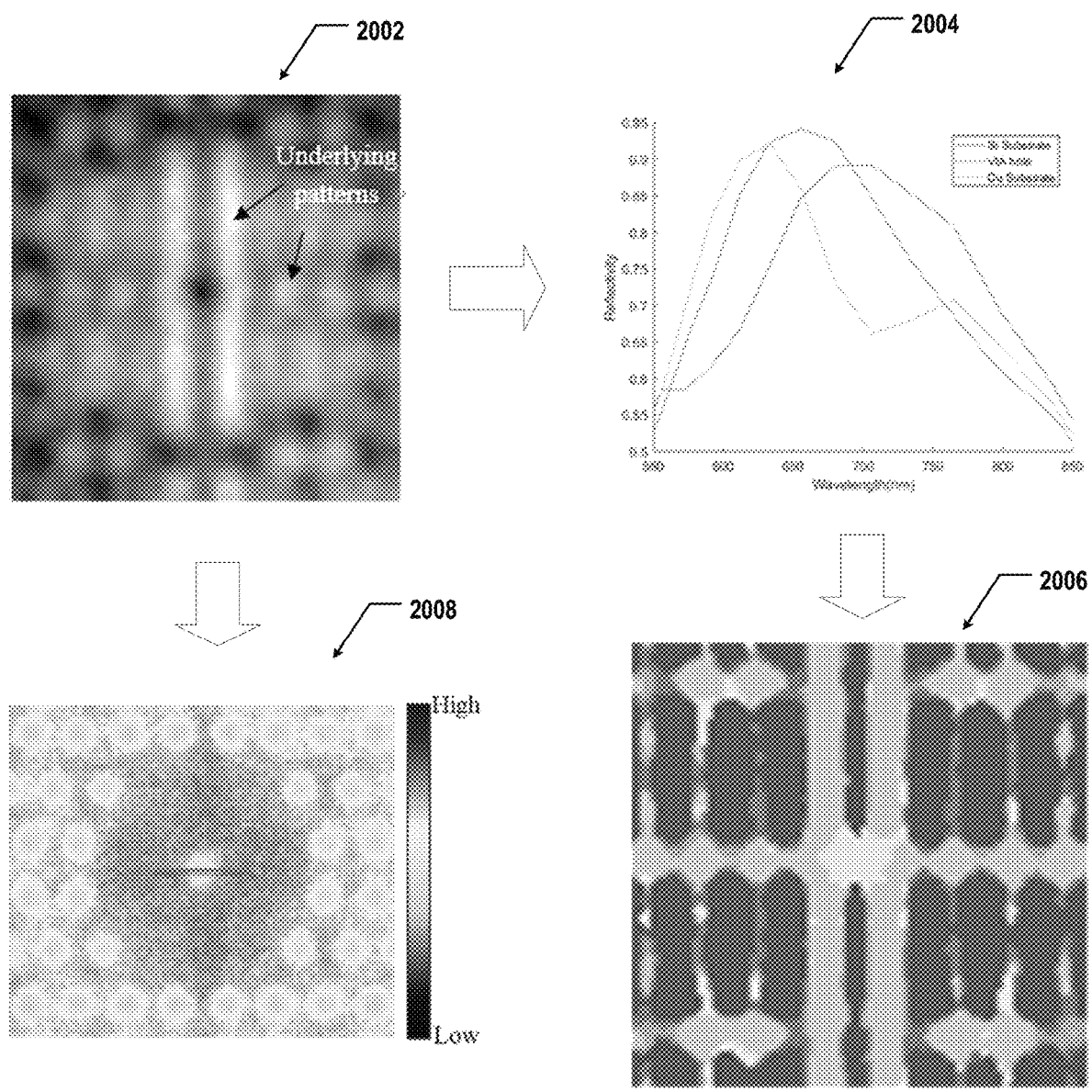
FIG. 20 illustrates exemplary semiconductor chip surface pattern, original height map, spectrum signals, and classification map, according to some embodiments of the present disclosure.

Referring to FIG. 19, method 1900 starts at operation 1102, in which an original height map is generated based, at least in part, on the received interference signals. For example, as shown in FIG. 20, an original height map 2008 may be generated based on the received interference signals corresponding to a semiconductor chip surface pattern 2002. Referring to FIG. 19, method 1900 proceeds to operation 1902, as illustrated in FIG. 19, in which a spectrum map is generated based, at least in part, on the received spectrum signals. For example, as shown in FIG. 20, spectrum signals 2004 corresponding to semiconductor chip surface pattern 2002 may be received from an optical spectrometer, which may be used to generate a spectrum map. Referring to FIG. 19, method 1900 proceeds to operation 1604, as illustrated in FIG. 19, in which the spectrum map is transformed into a classification map based, at least in part, on the classified spectrum signals and the categories. For example, as shown in FIG. 20, a classification map 2006 may be transformed from the spectrum map based on the classified spectrum signals and the categories. Classification map 2006 represents 3 categories each corresponding to a region having the same material in semiconductor chip surface pattern 2002, such as a tungsten vertical interconnect access (VIA), a copper layer, and a silicon substrate. Referring to FIG. 19, method 1900 proceeds to operation 1106, as illustrated in FIG. 19, in which a calibrated height map is generated from the original height map based, at least in part, on the surface height offset and the classification map.

Figure 21:
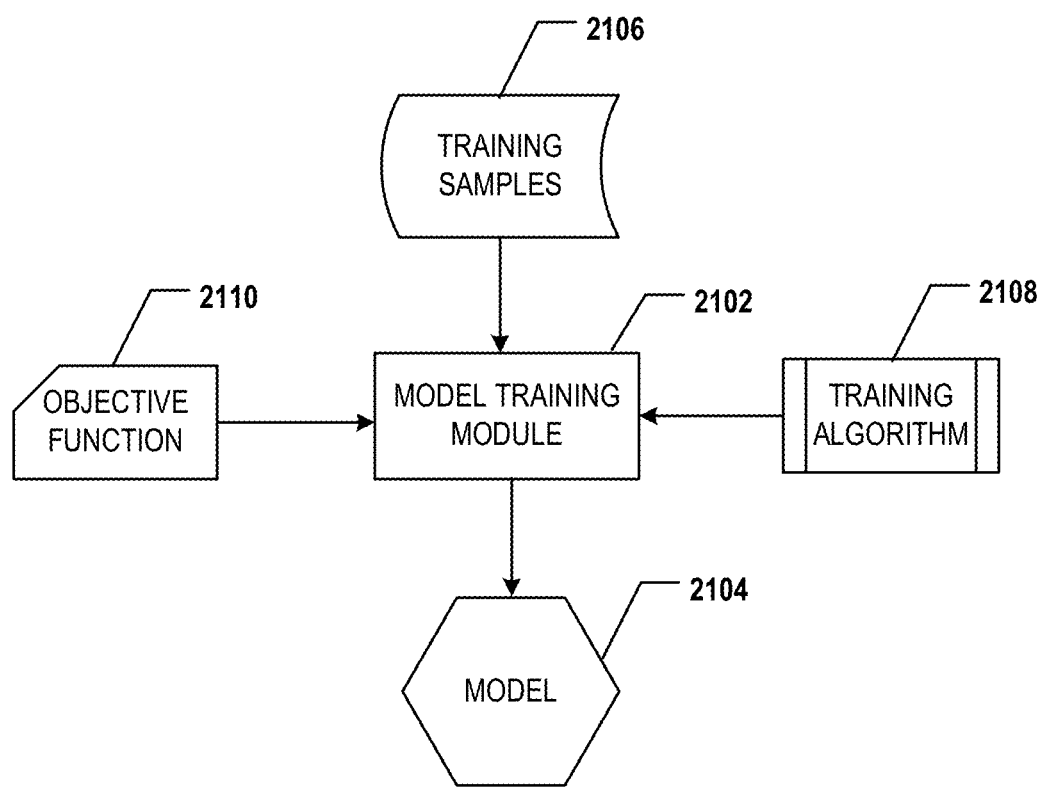
FIG. 21 illustrates a schematic diagram of an exemplary system for training a model for surface topography characterization, according to some embodiments of the present disclosure.

FIG. 21 illustrates a schematic diagram of an exemplary system 2100 for training a model 2104 for surface topography characterization, according to some embodiments of the present disclosure. Model 2104 may be any machine learning models disclosed herein, such as model 608 for classifying interference signals or model 1308 for classifying spectrum signals. System 2100 can include a plurality of functional modules and units implemented by at least one processor. In some embodiments, system 2100 includes a model training module 2102 configured to train model 2104 for classifying either interference signals or spectrum signals over a set of training samples 2106 (including interference signals or spectrum signals) based on an objective function 2110 (also known as a "loss function") using a training algorithm 2108. Model training module 2102 can provide model 2104 for classifying either interference signals or spectrum signals depending on the types of training samples 2106 (either interference signals or spectrum signals). Model 2104 can include a classification model, such as KNN, case-based reasoning, decision tree, naive Bayes, ANN, logistic regression, Fisher's linear discriminant, SVM, or perceptron.

To train model 2104 for classifying interference signals, model training module 2102 can also obtain training samples each including an interference signal and a labeled category of the interference signal. The interference signal corresponds to a position on a surface of a semiconductor chip, and the labeled category corresponds to a region having the same material on the surface of the semiconductor chip, according to some embodiments. For example, each training interference signal may be manually, automatically, or semi-automatically labeled with one of multiple predetermined categories each corresponding to a region having the same material on the surface of the semiconductor chip, such as silicon substrate, copper layer, tungsten VIA, silicon oxide layer, silicon nitride layer, to name a few. In some embodiments, at least part of the surface of the semiconductor chip includes a transparent layer, such as a silicon oxide layer, and at least one of the categories corresponds to the transparent layer. In some embodiments, a training interference signal includes an interference fringe of low coherent interferometry, which may be used as the signature for labeling the training interference signal.

To train model 2104 for classifying spectrum signals, model training module 2102 can also obtain training samples each including a spectrum signal and a labeled category of the spectrum signal. The spectrum signal corresponds to a position on a surface of a semiconductor chip, and the labeled category corresponds to a region having the same material on the surface of the semiconductor chip, according to some embodiments. For example, each training spectrum signal may be manually, automatically, or semi-automatically labeled with one of multiple predetermined categories each corresponding to a region having the same material on the surface of the semiconductor chip, such as silicon substrate, copper layer, tungsten VIA, silicon oxide layer, silicon nitride layer, to name a few. In some embodiments, at least part of the surface of the semiconductor chip includes a transparent layer, such as a silicon oxide layer, and at least one of the categories corresponds to the transparent layer. In some embodiments, a training spectrum signal includes a reflectance spectrum, which may be used as the signature for labeling the training spectrum signal.

To train model 2104 for classifying interference signals or spectrum signals, model training module 2102 can further adjust one or more parameters of model 2104 based, at least in part, on a difference between the labeled category and a classified category of the interference signal or the spectrum signal in each of training samples 2106. In some embodiments, model 2104 includes one or more parameters (e.g., the "k" in KNN) that can be jointly adjusted by model training module 2102 when being fed with training samples 2106. Model training module 2102 can jointly adjust the parameters of model 2104 to minimize objective function 2110 over training samples 2106 using training algorithm 2108. Any suitable objective function 2110 and training algorithm 2108 can be selected based on the specific type of model 2104 to be trained. For example, for a KNN model, a mean square error (MSE)-based objective function may be used by model training module 2102 in combination with a KNN classification training algorithm. It is understood that the training of model 2104, e.g., the adjustment of the parameter, may be performed in an iterative manner.

Figure 22:
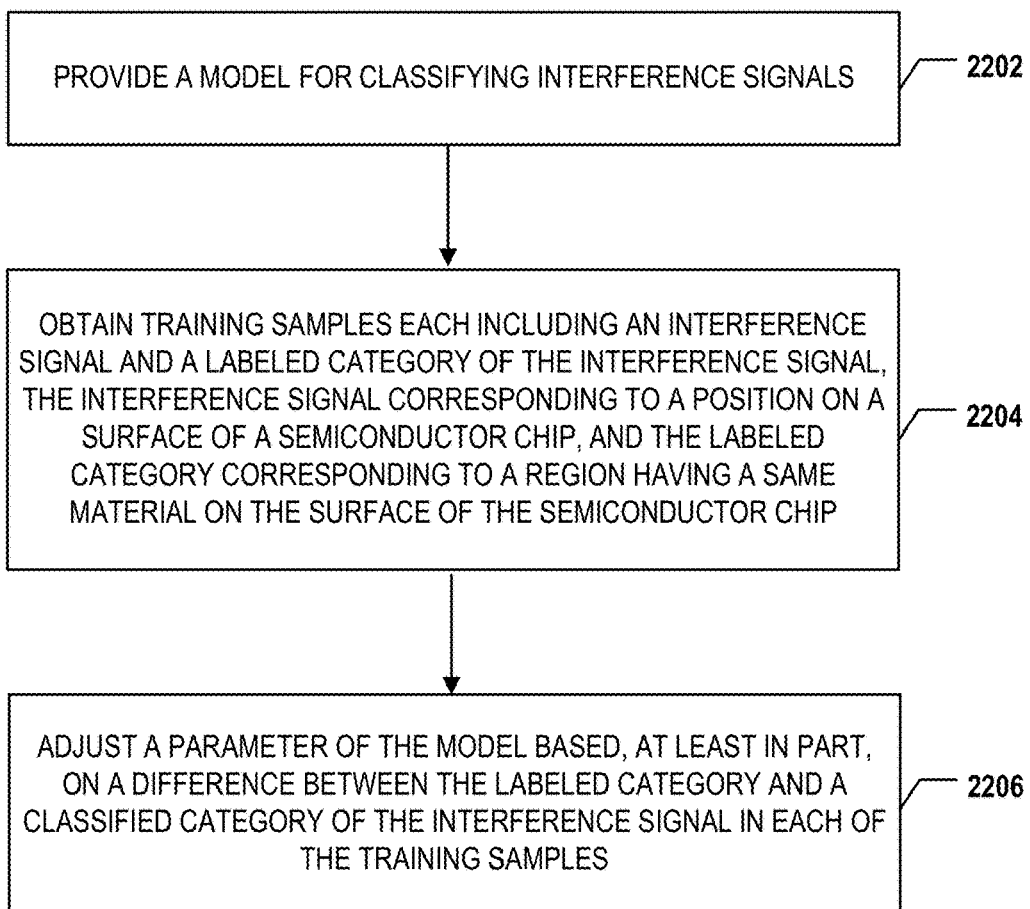
FIG. 22 a flowchart of an exemplary method for training a model for surface topography characterization, according to some embodiments of the present disclosure.

FIG. 22 a flowchart of an exemplary method 2200 for training a model for surface topography characterization, according to some embodiments of the present disclosure. Examples of the system that can perform operations of method 2200 include system 2100 depicted in FIG. 21. It is understood that the operations shown in method 2200 are not exhaustive and that other operations can be performed as well before, after, or between any of the illustrated operations. Further, some of the operations may be performed simultaneously, or in a different order than shown in FIG. 22.

Referring to FIG. 22, method 2200 starts at operation 2202, in which a model for classifying interference signals is provided. The model can include a classification model. For example, model 2104 may be provided to model training module 2102 of system 2100. Method 2200 proceeds to operation 2204, as illustrated in FIG. 22 in which a plurality of training samples each including an interference signal and a labeled category of the interference signal are obtained. The interference signal corresponds to a position on a surface of a semiconductor chip, and the labeled category corresponds to a region having the same material on the surface of the semiconductor chip, according to some embodiments. The interference signal can include an interference fringe of low coherent interferometry, and at least part of the surface of the semiconductor chip includes a transparent layer. For example, training samples 2106 may be obtained by model training module 2102. Method 2200 proceeds to operation 2206, as illustrated in FIG. 22 in which a parameter of the model is adjusted based, at least in part, on a difference between the labeled category and a classified category of the interference signal in each of the training samples. For example, one or more parameters of model 2104 may be adjusted by model training module 2102 over training samples 2106.

Figure 23:
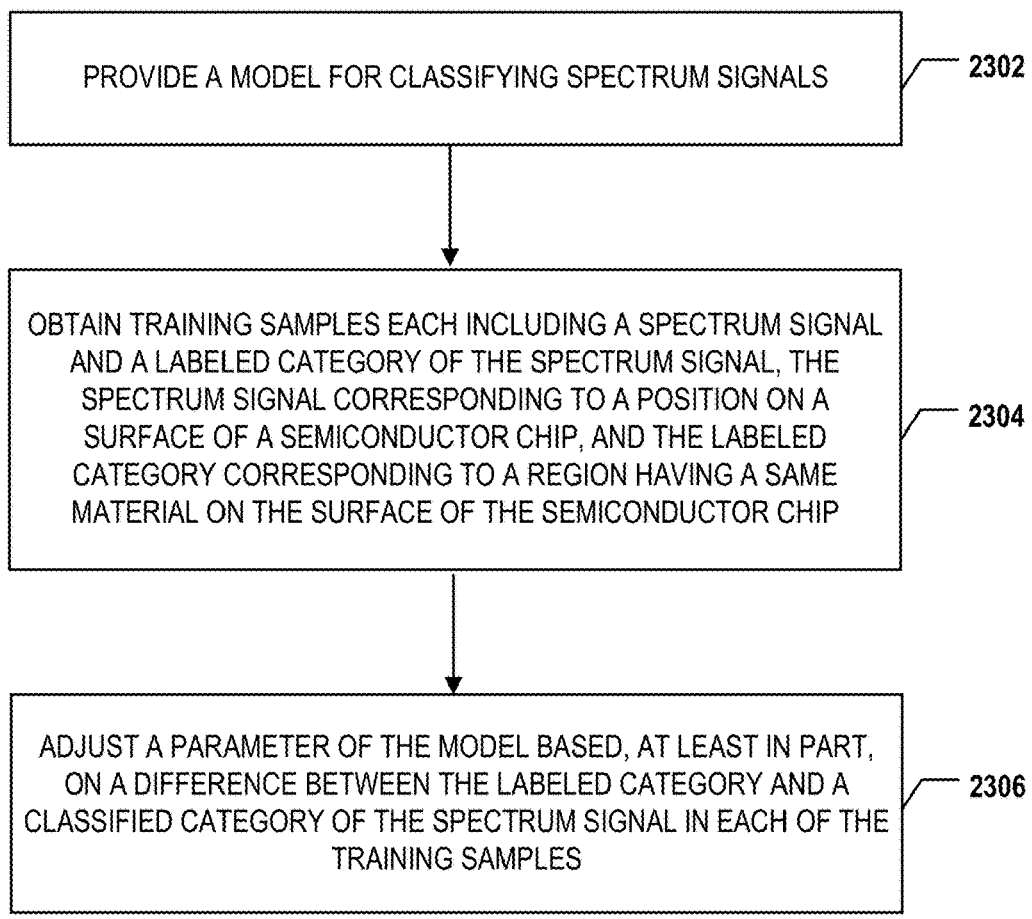
FIG. 23 a flowchart of another exemplary method for training a model for surface topography characterization, according to some embodiments of the present disclosure.

FIG. 23 a flowchart of another exemplary method 2300 for training a model for surface topography characterization, according to some embodiments of the present disclosure. Examples of the system that can perform operations of method 2300 include system 2100 depicted in FIG. 21. It is understood that the operations shown in method 2300 are not exhaustive and that other operations can be performed as well before, after, or between any of the illustrated operations. Further, some of the operations may be performed simultaneously, or in a different order than shown in FIG. 23.

Referring to FIG. 23, method 2300 starts at operation 2302, in which a model for classifying spectrum signals is provided. The model can include a classification model. For example, model 2104 may be provided to model training module 2102 of system 2100. Method 2300 proceeds to operation 2304, as illustrated in FIG. 23 in which a plurality of training samples each including a spectrum signal and a labeled category of the spectrum signal are obtained. The spectrum signal corresponds to a position on a surface of a semiconductor chip, and the labeled category corresponds to a region having the same material on the surface of the semiconductor chip, according to some embodiments. The spectrum signal can include a reflectance spectrum, and at least part of the surface of the semiconductor chip includes a transparent layer. For example, training samples 2106 may be obtained by model training module 2102. Method 2300 proceeds to operation 2306, as illustrated in FIG. 23 in which a parameter of the model is adjusted based, at least in part, on a difference between the labeled category and a classified category of the spectrum signal in each of the training samples. For example, one or more parameters of model 2104 may be adjusted by model training module 2102 over training samples 2106.

Figure 24:
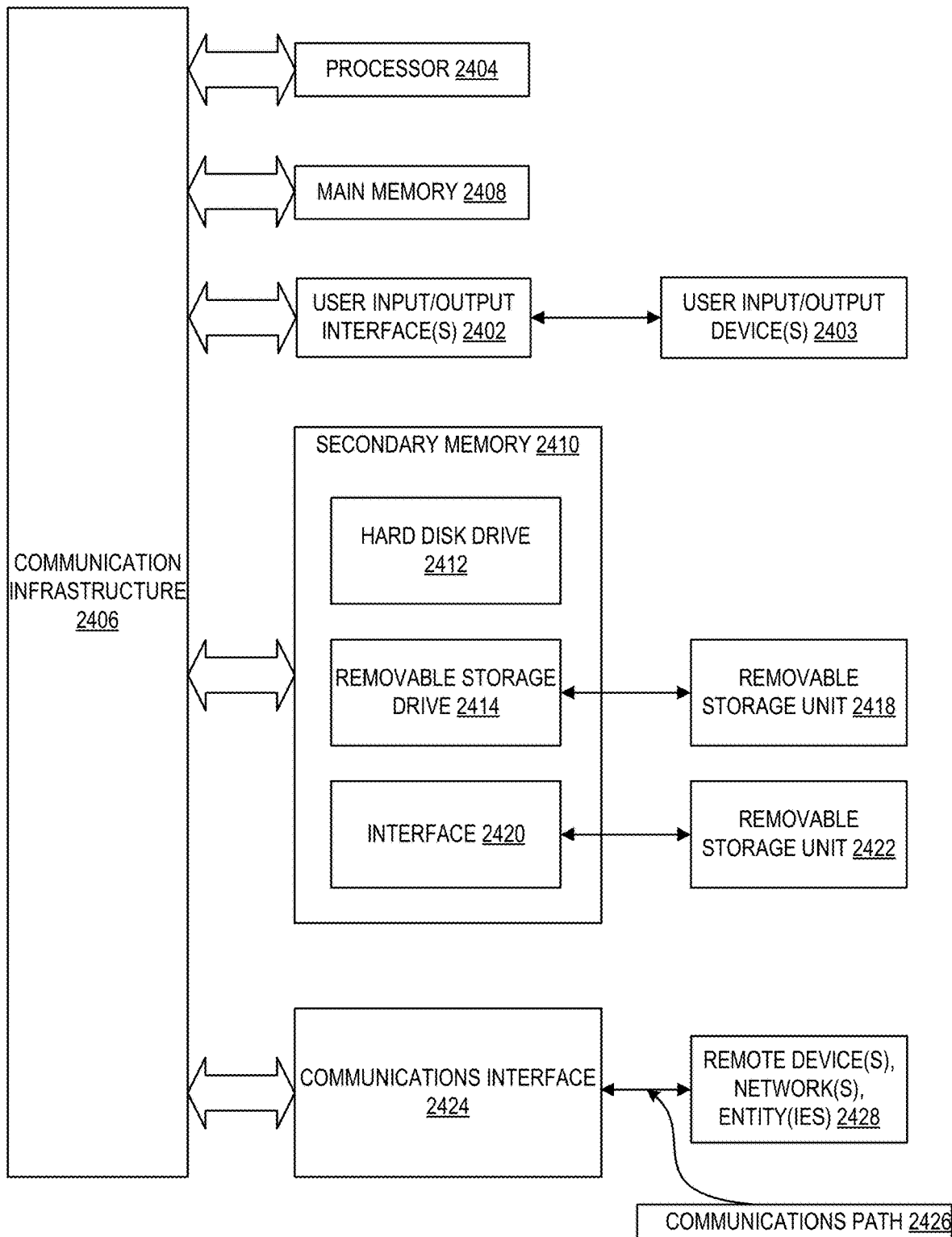
FIG. 24 illustrates a block diagram of an exemplary computing device, according to some embodiments of the present disclosure.

Various embodiments can be implemented, for example, using one or more computing devices, such as a computing device 2400 shown in FIG. 24. One or more computing devices 2400 can be an example of computing device 102 in FIG. 1 and can be used, for example, to implement method 900 of FIG. 9, method 1000 of FIG. 10, method 1100 of FIG. 11, method 1500 of FIG. 15, method 1600 of FIG. 16, method 1800 of FIG. 18, and method 1900 of FIG. 19. For example, computing device 2400 can perform various functions in surface topography metrology, such as interference signals and/or spectrum signals classification, surface height offset calibration, calibrated surface height calculation, as well as calibrated height node generation. One or more computing devices 2400 can also be an example of system 2100 in FIG. 21 and can be used, for example, to implement method 2200 of FIG. 22 and method 2300 of FIG. 23. For example, computing device 2400 can perform various functions in model training. Computing device 2400 can be any computer capable of performing the functions described herein.

Computing device 2400 can include one or more processors (also called central processing units, or CPUs), such as a processor 2404. Processor 2404 is connected to a communication infrastructure or bus 2406, according to some embodiments. One or more processors 2404 can each be a GPU. In some embodiments, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computing device 2400 can also include user input/output device(s) 2403, such as monitors, keyboards, pointing devices, etc., which communicate with communication infrastructure or bus 2406 through user input/output interface(s) 2402.

Computing device 2400 can also include a main or primary memory 2408, such as random-access memory (RAM). Main memory 2408 can include one or more levels of cache. Main memory 2408 has stored therein control logic (i.e., computer software) and/or data, according to some embodiments.

Computing device 2400 can also include one or more secondary storage devices or memory 2410. Secondary memory 2410 can include, for example, a hard disk drive 2412 and/or a removable storage device or drive 2414. Removable storage drive 2414 can be a floppy disk drive, a magnetic tape drive, a compact disk drive, an optical storage device, tape backup device, and/or any other storage device/drive.

Removable storage drive 2414 can interact with a removable storage unit 2418. Removable storage unit 2418 includes a computer usable or readable storage device having stored thereon computer software (control logic) and/or data, according to some embodiments. Removable storage unit 2418 can be a floppy disk, magnetic tape, compact disk, DVD, optical storage disk, and/any other computer data storage device. Removable storage drive 2414 can read from and/or writes to removable storage unit 2418 in a well-known manner.

According to some embodiments, secondary memory 2410 can include other means, instrumentalities or other approaches for allowing computer programs and/or other instructions and/or data to be accessed by computing device 2400. Such means, instrumentalities or other approaches may include, for example, a removable storage unit 2422 and an interface 2420. Examples of removable storage unit 2422 and interface 2420 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computing device 2400 can further include a communication or network interface 2424. Communication interface 2424 enables computing device 2400 to communicate and interact with any combination of remote devices, remote networks, remote entities, etc. (individually and collectively referenced by reference number 2428), according to some embodiments. For example, communication interface 2424 may allow computing device 2400 to communicate with remote devices 2428 over communications path 2426, which may be wired and/or wireless, and which may include any combination of LANs, WANs, the Internet, etc. Control logic and/or data may be transmitted to and from computing device 2400 via communication path 2426.

In some embodiments, a tangible apparatus or article of manufacture comprising a tangible computer useable or readable medium having control logic (software) stored thereon is also referred to herein as a computer program product or program storage device. This includes, but is not limited to, computing device 2400, main memory 2408, secondary memory 2410, and removable storage units 2418 and 2422, as well as tangible articles of manufacture embodying any combination of the foregoing. Such control logic, when executed by one or more data processing devices (such as computing device 2400), causes such data processing devices to operate as described herein.

Based on the teachings contained in this disclosure, it will be apparent to persons skilled in the relevant art(s) how to make and use embodiments of the present disclosure using data processing devices, computer systems and/or computer architectures other than that shown in FIG. 24. In particular, embodiments may operate with software, hardware, and/or operating system implementations other than those described herein.

According to one aspect of the present disclosure, a system for classifying interference signals includes an interferometer including a light source and a detector, and at least one processor. The interferometer is configured to provide a plurality of interference signals each corresponding to a respective one of a plurality of positions on a surface of a semiconductor chip. A spectrum of the light source is greater than a spectrum of white light. The at least one processor is configured to classify the interference signals into a plurality of categories using a model. Each of the categories corresponds to a region having a same material on the surface of the semiconductor chip.

In some embodiments, the spectrum of the light source comprises at least one of UV light or IR light.

In some embodiments, a range of wavelengths of the spectrum of the light source is greater than a range between about 400 nm and about 900 nm. In some embodiments, the range of wavelengths of the spectrum of the light source is between about 190 nm and about 1,100 nm.

In some embodiments, the light source includes a Xe lamp. In some embodiments, the detector includes a white light CCD or a white light CMOS image sensor.

In some embodiments, each of the interference signals includes an interference fringe having a width not greater than about 2 µm. In some embodiments the width of the interference fringe is about 1.2 µm.

In some embodiments, at least part of the surface of the semiconductor chip includes a transparent layer. In some embodiments, a minimum thickness of the transparent layer is not greater than about 2 µm.

In some embodiments, the interferometer further includes an optical element configured to manipulate the spectrum of the light source. In some embodiments, the optical element includes at least one of a filter or an antireflection film.

According to another aspect of the present disclosure, a system for classifying interference signals includes an interferometer including a light source and a detector, and at least one processor. The interferometer is configured to provide a plurality of interference signals each corresponding to a respective one of a plurality of positions on a surface of a semiconductor chip. Each of the interference signals includes an interference fringe having a width not greater than about 2 µm. The at least one processor is configured to classify the interference signals into a plurality of categories using a model. Each of the categories corresponds to a region having a same material on the surface of the semiconductor chip.

In some embodiments the width of the interference fringe is about 1.2 µm.

In some embodiments, at least part of the surface of the semiconductor chip includes a transparent layer. In some embodiments, a minimum thickness of the transparent layer is not greater than about 2 µm.

In some embodiments, a spectrum of the light source is greater than a spectrum of white light. In some embodiments, the spectrum of the light source comprises at least one of UV light or IR light.

In some embodiments, a range of wavelengths of the spectrum of the light source is greater than a range between about 400 nm and about 900 nm. In some embodiments, the range of wavelengths of the spectrum of the light source is between about 190 nm and about 1,100 nm.

In some embodiments, the interferometer further includes an optical element configured to manipulate the spectrum of the light source. In some embodiments, the optical element includes at least one of a filter or an antireflection film.

In some embodiments, the light source includes a Xe lamp. In some embodiments, the detector includes a white light CCD or a white light CMOS image sensor.

According to still another aspect of the present disclosure, a system for classifying spectrum signals includes an interferometer including a light source and a detector, and at least one processor. The interferometer is configured to provide a plurality of interference signals each corresponding to a respective one of a plurality of positions on a surface of a semiconductor chip. A spectrum of the light source is greater than a spectrum of white light. The at least one processor is configured to transform the plurality of interference signals into a plurality of spectrum signals each corresponding to the respective one of the positions on the surface of the semiconductor chip, and classify the spectrum signals into a plurality of categories using a model. Each of the categories corresponds to a region having a same material on the surface of the semiconductor chip.

In some embodiments, the spectrum of the light source comprises at least one of UV light or IR light.

In some embodiments, a range of wavelengths of the spectrum of the light source is greater than a range between about 400 nm and about 900 nm. In some embodiments, the range of wavelengths of the spectrum of the light source is between about 190 nm and about 1,100 nm.

In some embodiments, the light source includes a Xe lamp. In some embodiments, the detector includes a white light CCD or a white light CMOS image sensor.

In some embodiments, each of the interference signals includes an interference fringe having a width not greater than about 2 µm. In some embodiments the width of the interference fringe is about 1.2 µm.

In some embodiments, at least part of the surface of the semiconductor chip includes a transparent layer. In some embodiments, a minimum thickness of the transparent layer is not greater than about 2 µm.

In some embodiments, the interferometer further includes an optical element configured to manipulate the spectrum of the light source. In some embodiments, the optical element includes at least one of a filter or an antireflection film.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A system for classifying interference signals, comprising:
    an interferometer comprising a light source and a detector, the interferometer configured to provide a plurality of interference signals each corresponding to a respective one of a plurality of positions on a surface of a semiconductor chip, wherein a spectrum of the light source is greater than a spectrum of white light; and
    at least one processor configured to:
        cluster the plurality of interference signals into a plurality of clusters using a model; and
        adjust the plurality of clusters into a plurality of categories based on a design of the semiconductor chip, wherein the plurality of categories are associated with interference signal classification, and wherein each of the plurality of categories corresponds to a region having a same material on the surface of the semiconductor chip.

2. The system of claim 1, wherein the spectrum of the light source comprises at least one of ultraviolet (UV) light or infrared (IR) light.

3. The system of claim 1, wherein a range of wavelengths of the spectrum of the light source is greater than a range between about 400 nm and about 900 nm.

4. The system of claim 3, wherein the range of wavelengths of the spectrum of the light source is between about 190 nm and about 1,100 nm.

5. The system of claim 1, wherein the light source comprises a Xenon (Xe) lamp.

6. The system of claim 5, wherein the detector comprises a white light charge coupled device (CCD) or a white light charge complementary metal oxide semiconductor (CMOS) image sensor.

7. The system of claim 1, wherein each of the interference signals comprises an interference fringe having a width not greater than about 2 µm.

8. The system of claim 7, wherein the width of the interference fringe is about 1.2 µm.

9. The system of claim 1, wherein at least part of the surface of the semiconductor chip comprises a transparent layer.

10. The system of claim 9, wherein a minimum thickness of the transparent layer is not greater than about 2 µm.

11. The system of claim 1, wherein the interferometer further comprises an optical element configured to manipulate the spectrum of the light source.

12. The system of claim 11, wherein the optical element comprises at least one of a filter or an antireflection film.

13. A system for classifying interference signals, comprising:
    an interferometer comprising a light source and a detector, the interferometer configured to provide a plurality of interference signals each corresponding to a respective one of a plurality of positions on a surface of a semiconductor chip, wherein each of the interference signals comprises an interference fringe having a width not greater than about 2 µm; and
    at least one processor configured to:
        cluster the plurality of interference signals into a plurality of clusters using a model; and
        adjust the plurality of clusters into a plurality of categories based on a design of the semiconductor chip, wherein the plurality of categories are associated with interference signal classification, and wherein each of the plurality of categories corresponds to a region having a same material on the surface of the semiconductor chip.

14. The system of claim 13, wherein the width of the interference fringe is about 1.2 µm.

15. The system of claim 13, wherein a spectrum of the light source is greater than a spectrum of white light.

16. The system of claim 15, wherein the spectrum of the light source comprises at least one of ultraviolet (UV) light or infrared (IR) light.

17. The system of claim 15, wherein a range of wavelengths of the spectrum of the light source is greater than a range between about 400 nm and about 900 nm.

18. The system of claim 13, wherein the light source comprises a Xenon (Xe) lamp.

19. The system of claim 18, wherein the detector comprises a white light charge coupled device (CCD) or a white light charge complementary metal oxide semiconductor (CMOS) image sensor.

20. A system for classifying spectrum signals, comprising:
    an interferometer comprising a light source and a detector, the interferometer configured to provide a plurality of interference signals each corresponding to a respective one of a plurality of positions on a surface of a semiconductor chip, wherein a spectrum of the light source is greater than a spectrum of white light; and
    at least one processor configured to:
        transform the plurality of interference signals into a plurality of spectrum signals each corresponding to a respective one of the positions on the surface of the semiconductor chip;
        cluster the plurality of interference signals into a plurality of clusters using a model; and
        adjust the plurality of clusters into a plurality of categories based on a design of the semiconductor chip, wherein the plurality of categories are associated with interference signal classification, and wherein each of the plurality of categories corresponds to a region having a same material on the surface of the semiconductor chip.

\* \* \* \* \*